US009425824B2

(12) United States Patent
Yu

(10) Patent No.: US 9,425,824 B2
(45) Date of Patent: Aug. 23, 2016

(54) CONFIGURABLE MULTI-MODE MEDIA INDEPENDENT INTERFACE

(75) Inventor: Hongchun Yu, Shanghai (CN)

(73) Assignee: QUALCOMM Incorporated, San Diego, CA (US)

( * ) Notice: Subject to any disclaimer, the term of this patent is extended or adjusted under 35 U.S.C. 154(b) by 24 days.

(21) Appl. No.: 14/382,279

(22) PCT Filed: Mar. 23, 2012

(86) PCT No.: PCT/CN2012/072898
§ 371 (c)(1),
(2), (4) Date: Aug. 29, 2014

(87) PCT Pub. No.: WO2013/139033
PCT Pub. Date: Sep. 26, 2013

(65) Prior Publication Data
US 2015/0171892 A1    Jun. 18, 2015

(51) Int. Cl.
| | |
|---|---|
| H03M 9/00 | (2006.01) |
| H04J 3/04 | (2006.01) |
| H04L 12/24 | (2006.01) |
| H04L 29/06 | (2006.01) |
| H04L 25/49 | (2006.01) |
| H04J 3/06 | (2006.01) |

(52) U.S. Cl.
CPC ............... *H03M 9/00* (2013.01); *H04J 3/047* (2013.01); *H04L 25/4908* (2013.01); *H04L 41/0803* (2013.01); *H04L 69/18* (2013.01); *H04J 3/0697* (2013.01)

(58) Field of Classification Search
CPC .................. H04L 12/40136; H04L 12/40039; Y02B 60/35; Y02B 60/31; Y02B 60/44; H04J 3/16; G09G 2370/10
See application file for complete search history.

(56) References Cited

U.S. PATENT DOCUMENTS

| | | | |
|---|---|---|---|
| 6,067,585 A | 5/2000 | Hoang | |
| 7,356,047 B1 * | 4/2008 | Mahalawat et al. | ........... 370/469 |
| 7,492,291 B2 | 2/2009 | Murray et al. | |
| 7,720,068 B2 | 5/2010 | McClellan | |
| 7,835,389 B2 | 11/2010 | Yu et al. | |
| 7,934,038 B1 * | 4/2011 | Kao et al. | ....................... 710/305 |
| 7,957,391 B1 | 6/2011 | Subramanian | |
| 8,127,164 B2 | 2/2012 | Diab et al. | |

(Continued)

FOREIGN PATENT DOCUMENTS

| | | |
|---|---|---|
| CN | 1667965 A | 9/2005 |
| CN | 1928753 A | 3/2007 |

(Continued)

OTHER PUBLICATIONS

International Search Report and Written Opinion—PCT/CN2012/072898—ISA/EPO—Jan. 3, 2013.

(Continued)

*Primary Examiner* — Jung Park
(74) *Attorney, Agent, or Firm* — Paradice and Li LLP

(57) ABSTRACT

A configurable media independent interface in an integrated circuit device includes a first plurality of channels and a second plurality of channels, wherein each channel of the first and second pluralities includes a transmit path. The interface also includes a first serializer configurable to serialize transmit data for the first and second pluralities of channels in a first mode and to serialize transmit data for the first plurality of channels in a second mode, and a second serializer configurable to be disabled in the first mode and to serialize data for the second plurality of channels in the second mode.

20 Claims, 13 Drawing Sheets

(56) References Cited

U.S. PATENT DOCUMENTS

| | | | |
|---|---|---|---|
| 2002/0110144 A1 | 8/2002 | Gibson et al. | |
| 2003/0058894 A1* | 3/2003 | Feuerstraeter et al. | 370/518 |
| 2003/0179771 A1* | 9/2003 | Chan et al. | 370/445 |
| 2005/0036524 A1* | 2/2005 | Wojtowicz | 370/537 |
| 2007/0116055 A1 | 5/2007 | Atsumi et al. | |
| 2008/0225841 A1* | 9/2008 | Conway et al. | 370/389 |
| 2009/0092145 A1 | 4/2009 | Kondo | |
| 2013/0060979 A1* | 3/2013 | Dove | 710/104 |

FOREIGN PATENT DOCUMENTS

| | | |
|---|---|---|
| CN | 101615912 A | 12/2009 |
| CN | 101867430 A | 10/2010 |
| CN | 102224702 A | 10/2011 |
| JP | H11187052 A | 7/1999 |
| JP | 2004511180 A | 4/2004 |
| WO | WO-2011152818 A1 | 12/2011 |

OTHER PUBLICATIONS

"Reusing a 10Gbps Ethernet Media Access Controller for a 1Gbps/100Mbps/10Mbps Ethernet", IP.Com Journal, IP.Com Inc., West Henrietta~NY, US, Jan. 25, 2006, pp. 1-5, XP013112591, ISSN: 1533-0001 * p. 1 * * figures 1,2 *.

Supplementary European Search Report—EP12871888—Search Authority—The Hague—Oct. 22, 2015.

* cited by examiner

Functional Block of One Channel

CONFIGURABLE MULTI-MODE MEDIA INDEPENDENT INTERFACE

TECHNICAL FIELD

The present embodiments relate generally to electronic communications, and specifically to Ethernet communication systems.

BACKGROUND OF RELATED ART

Among the technologies that allow computers and/or other network devices to form a local area network (LAN), Ethernet has become the dominant networking technology and is standardized in the IEEE 802.3 family of standards. The Ethernet standard has evolved over time so that different variants of the Ethernet protocol now exist to support higher bandwidth, improved media access controls, different physical media channels, and/or other functionalities. For example, IEEE 802.3 now has variants covering speeds (or transmission rates) ranging from 10 Mbit/s, 100 Mbit/s, 1 Gbit/s, to 10 Gbit/sand even higher, and has variants that govern physical channels such as coaxial cables, fiber-optics, and unshielded/shielded twisted-pair cables.

In systems and devices that communicate using the Ethernet protocol, an interface exists between the media access control (MAC) layer and the physical layer to facilitate the exchange of information between the two layers. This interface is referred to as a media independent interface (MII). The term MII also refers to a specific type of media independent interfaces, in addition to referring to the entire genus. As used herein, the terms "media access interface" and "MII" will refer to the entire genus of such interfaces, unless otherwise noted. Examples of MIIs include Attachment Unit Interface (AUI), MII, Reduced MII, Gigabit MII (GMII), Reduced GMII, Serial GMII (SGMII), Quad SGMII (QSGMII), 10GMII, and Source Synchronous Serial MII (S3MII).

Designing media independent interfaces presents significant engineering challenges. Examples of these challenges include reducing or minimizing electromagnetic interference (EMI), power consumption, pin count, and circuit board complexity. Accordingly, there is a need for more efficient MII designs. Also, there is a need for new designs to be configurable for backward compatibility with existing MII protocols, to simplify manufacturing.

BRIEF DESCRIPTION OF THE DRAWINGS

The present embodiments are illustrated by way of example and are not intended to be limited by the figures of the accompanying drawings.

Like reference numerals refer to corresponding parts throughout the drawing figures and specification.

DETAILED DESCRIPTION

Methods and apparatuses for communicating between physical layer devices (PHYs) and media access controllers (MACs) are disclosed that transmit signals for a plurality of channels over a single serial data path (e.g., a serial dual-data rate data path), without transmitting a corresponding clock signal. In some embodiments, signals for the plurality of channels are transmitted from a PHY to a MAC via a first differential pair and from the MAC to the PHY via a second differential pair. In other embodiments, similar methods and apparatuses are used for direct communication between two MACs.

In the following description, numerous specific details are set forth such as examples of specific components, circuits, and processes to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scopes all embodiments defined by the appended claims.

Figure 1:
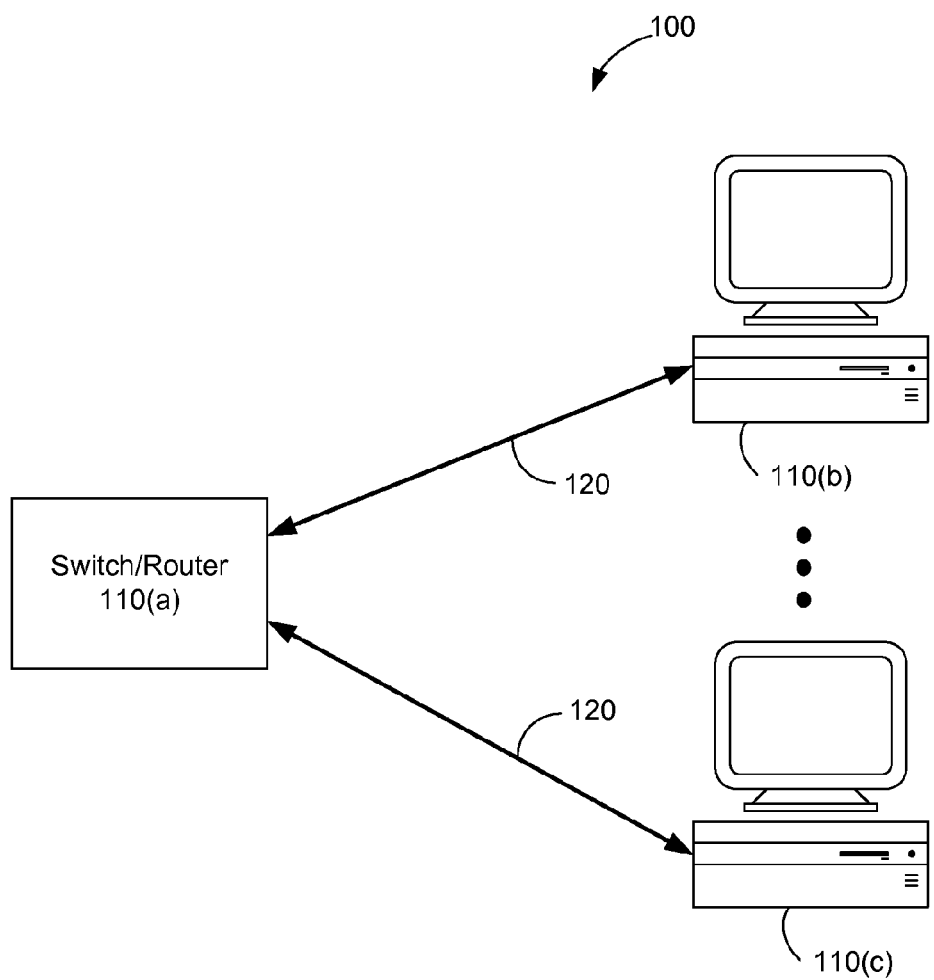
FIG. 1 is a block diagram of a communication system within which the present embodiments may be implemented.

FIG. 1 is a block diagram of an exemplary communication system 100 within which the present embodiments may be implemented. Communication system 100 is shown to include a network device (e.g., a switch or router) 110(*a*)

coupled to a plurality of network devices 110(b) and 110(c) via respective data links 120. Network devices 110(b) and 110(c) may exchange data with the switch/router 110(a) (and thus with each other) through respective data links 120. Network devices 110(b) and 110(c) may be any suitable network-enabled devices including, for example, computers, switches, routers, hubs, gateways, access points, or the like. Also, according to the present embodiments, network devices 110(b) and 110(c) may include any electronic device capable of connecting to either a wired or a wireless network including, for example, a mobile phone, a personal digital assistant (PDA), a set-top box, or a game console. Of course, router/switch 110(a), network devices 110(b) and 110(c), and data links 120 are just exemplary components of a network, as the network may further include any number of suitable devices to form a larger network including, for example, a local area network (LAN), a wide area network (WAN), a wireless LAN (WLAN), and/or may be connected to the Internet. Data links 120 may be any suitable physical media channel including, for example, coaxial cables, fiber-optics, and/or unshielded/shielded twisted pairs.

Network devices 110(a)-110(c) may communicate with each other using Ethernet technologies, as described in the IEEE 802.3 family of standards. More specifically, for exemplary embodiments described herein, network devices 110(a)-110(c) are each equipped with Ethernet-compliant transceivers (not shown in FIG. 1 for simplicity) that are capable of transmitting and receiving data packets at speeds of, for example, 100 Mbit/s and/or 10 Mbit/s.

Figure 2:
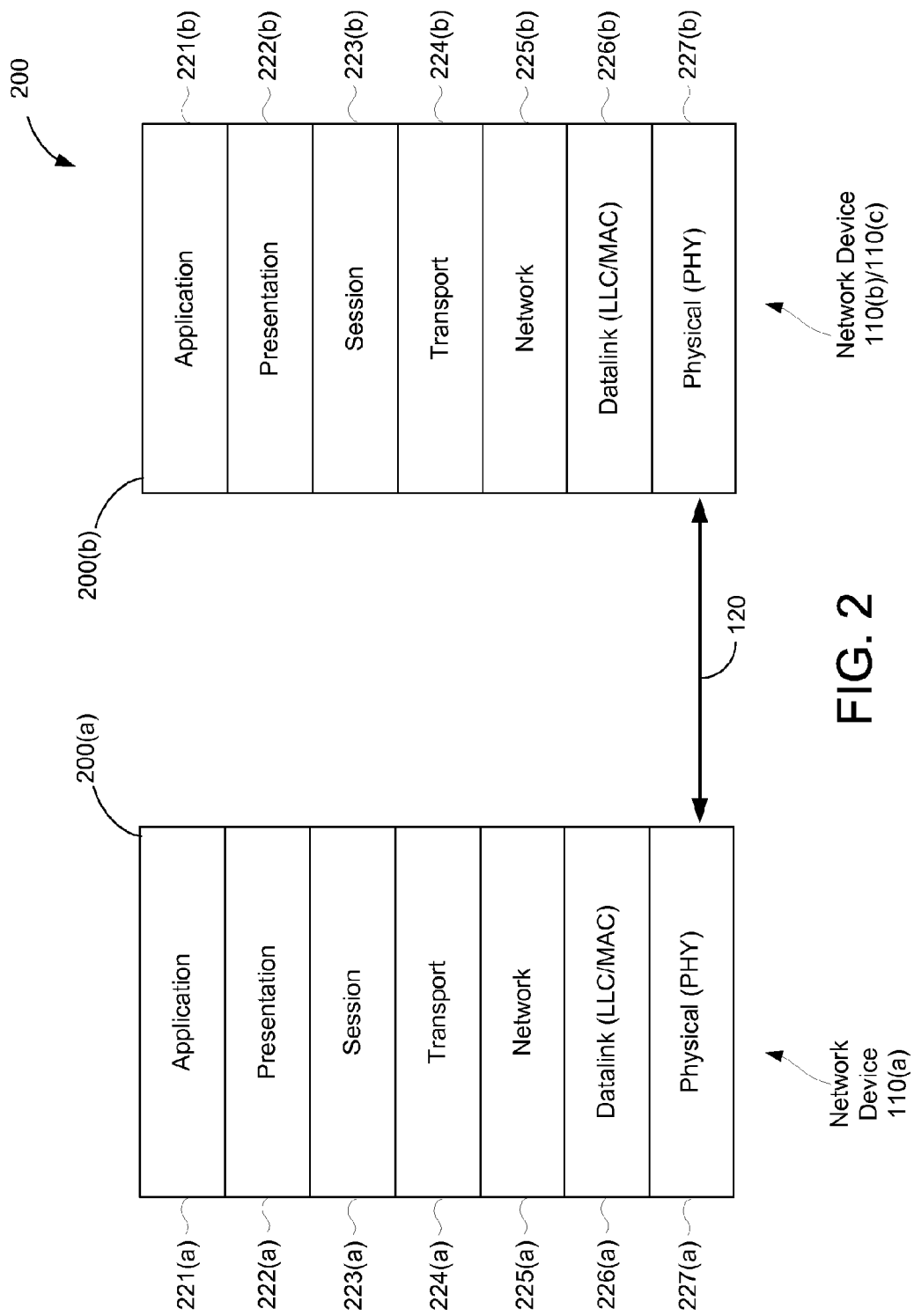
FIG. 2 is a block diagram of the open system interconnection (OSI) model representative of the network devices of FIG. 1.

FIG. 2 is a block diagram of the open system interconnection (OSI) models 200(a)-200(b) representative of the network devices 110(a) and 110(b) or 110(c), respectively, of FIG. 1. As in FIG. 1, network devices 110(a) and 110(b) or 110(c) are coupled to each other by the established data link (or physical channel) 120. As depicted in FIG. 2, the OSI model 200 is divided into seven logical layers: (1) an application layer 221; (2) a presentation layer 222; (3) a session layer 223; (4) a transport layer 224; (5) a network layer 225; (6) a datalink layer 226; and (7) a physical layer 227. Although the OSI model 200 may be used to represent network devices 110(a) and 110(b)/110(c) for purposes of discussion herein, it is noted that other suitable models maybe used to represent Ethernet devices configured in accordance with the present embodiments.

The higher in hierarchy an OSI layer is, the closer it is to an end user; the lower in hierarchy an OSI layer is, the closer it is to a physical channel. For example, on the top of the OSI model hierarchy is application layer 221, which interacts directly with the end user's software application (not shown in FIG. 2 for simplicity). On the contrary, on the bottom of the OSI model hierarchy is physical layer 227, which defines the relationship between a network device and a physical communication medium, such as twisted-pairs for Ethernet data transmissions.

More specifically, physical layer 227 provides electrical and physical specifications, including details like pin layouts and signal voltages, for interactions between network device 110 and physical channel 120. Datalink layer 226 provides the functional and/or procedural details, such as addressing and channel access control mechanisms, for data transmissions between network devices 110(a) and 110(b)/110(c). Datalink layer 226 has two sub-layers, which are the logical link control (LLC) layer on the top (in terms of hierarchy), and the media access control (MAC) layer on the bottom. For simplicity, datalink layer 226 is sometimes referred to herein as the MAC layer in the following discussion. Although not shown for simplicity in FIG. 2, an interface exists between the MAC layer 226 and the physical layer 227 to facilitate the exchange of information between the two layers. This interface is referred to as a media independent interface (MII), because the MAC layer is agnostic as to the physical medium used for transmission. (As used herein, the terms "media access interface" and "MII" refer to the entire genus of such interfaces and not to the specific interface of the same name, unless otherwise noted.) The MII allows network devices 110(a) and/or 110(b)/110(c) to interface with different types of physical channels 120 without necessarily replacing their MAC devices 226.

Figure 3:
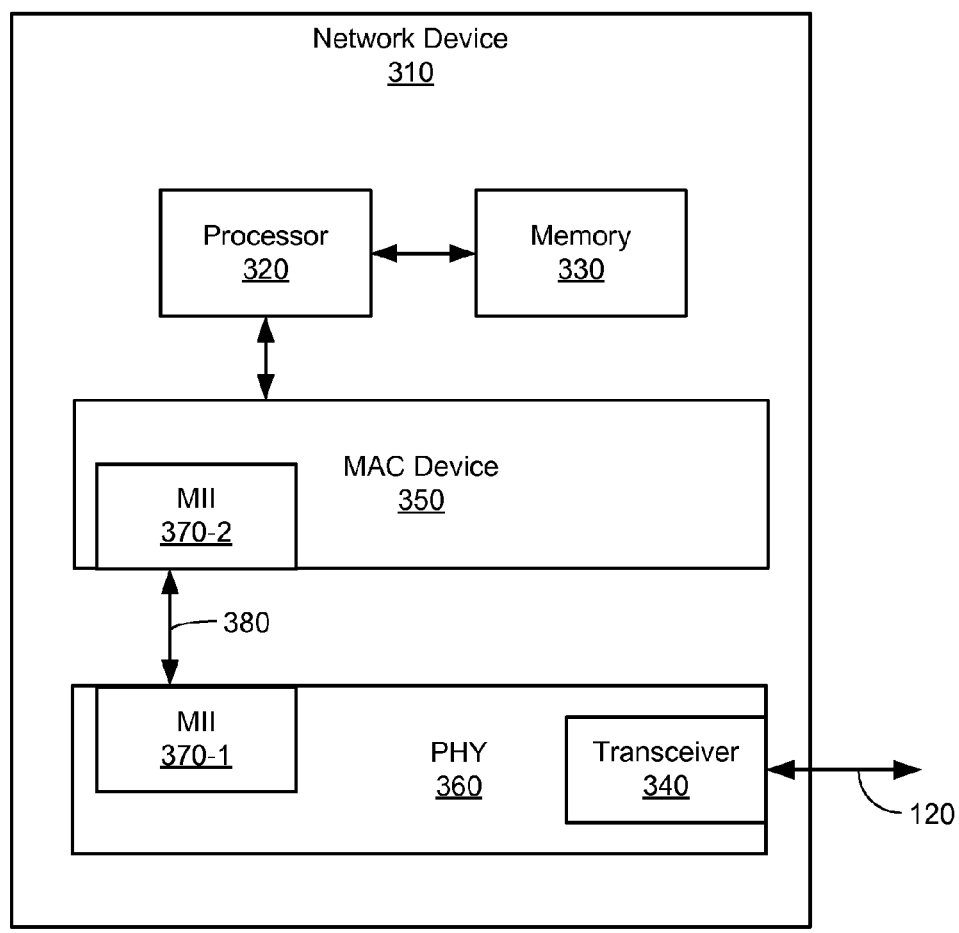
FIG. 3 is a block diagram of a network device of FIG. 1 in accordance with some embodiments.

FIG. 3 is a functional block diagram of a network device 310 that is one embodiment of the network devices 110(a) and/or 110(b)/110(c) of FIGS. 1 and 2. Network device 310 includes a processor 320, a memory 330, and an Ethernet transceiver circuit 340, which is coupled to one or more physical channels 120 of FIG. 2. In some embodiments, the transceiver circuit 340 includes transceiver circuitry for a plurality of channels (e.g., eight channels), and thus includes a plurality of ports (e.g., eight ports). Although Ethernet transceiver 340 is illustrated in FIG. 3 as being included in PHY 360, for other embodiments, transceiver 340 may be a stand-alone device or integrated circuit. Memory 330 may be any suitable memory element or device including, for example, EEPROM or Flash memory. Processor 320 may be any suitable processor capable of executing scripts or instructions of one or more software programs stored, for example, in memory 330. Although not shown in FIG. 3 for simplicity, network device 310 may also include a well-known cache memory that stores frequently used instructions and/or data.

Network device 310 includes a physical layer device (PHY) 360 and a MAC layer device (or MAC device) 350. PHY 360 and MAC device 350 each include a media independent interface 370-1 and 370-2, respectively, for transmitting signals between the two devices via a set of signal paths 380. In some embodiments, the signal paths 380 include a first differential pair (e.g., a low-voltage differential signaling pair) of signal lines for transmitting signals from PHY 360 to MAC device 350 and a second differential pair (e.g., a low-voltage differential signaling pair) of signal lines for transmitting signals from MAC device 350 to PHY 360. Each differential pair provides a one-bit data path between PHY 360 and MAC device 350. The signal paths thus include a first serial path from PHY 360 to MAC device 350 and a second serial path from MAC device 350 to PHY 360. In some embodiments, the signal paths 380 do not include any signal lines for transmitting clock signals between PHY 360 and MAC device 350. For example, the interfaces 370-1 and 370-2 may not be source-synchronous.

MAC device 350 may be any device or integrated circuit that implements the functions of MAC layer (e.g., layer 226 of FIG. 2), and may be a stand-alone device or may be integrated into network device 310. Similarly, PHY 360 may be any device or integrated circuit that implements the functions of the physical layer (e.g., layer 227 of FIG. 2), and may be a stand-alone device or may be integrated into network device 310. In some embodiments, PHY 360 and MAC device 350 are each implemented in integrated circuits mounted on a circuit board, and the signals paths 380 are implemented as traces on the circuit board.

During normal data transmission operations, when an end-user software application on network device 310 transmits data through the network (e.g., to the Internet), processor 320 processes the data in accordance with the top layers of the OSI model and then transmits the data through MAC device 350 to PHY 360. Then, PHY 360 transmits the data via transceiver 340 onto a physical channel 120.

Figure 4:
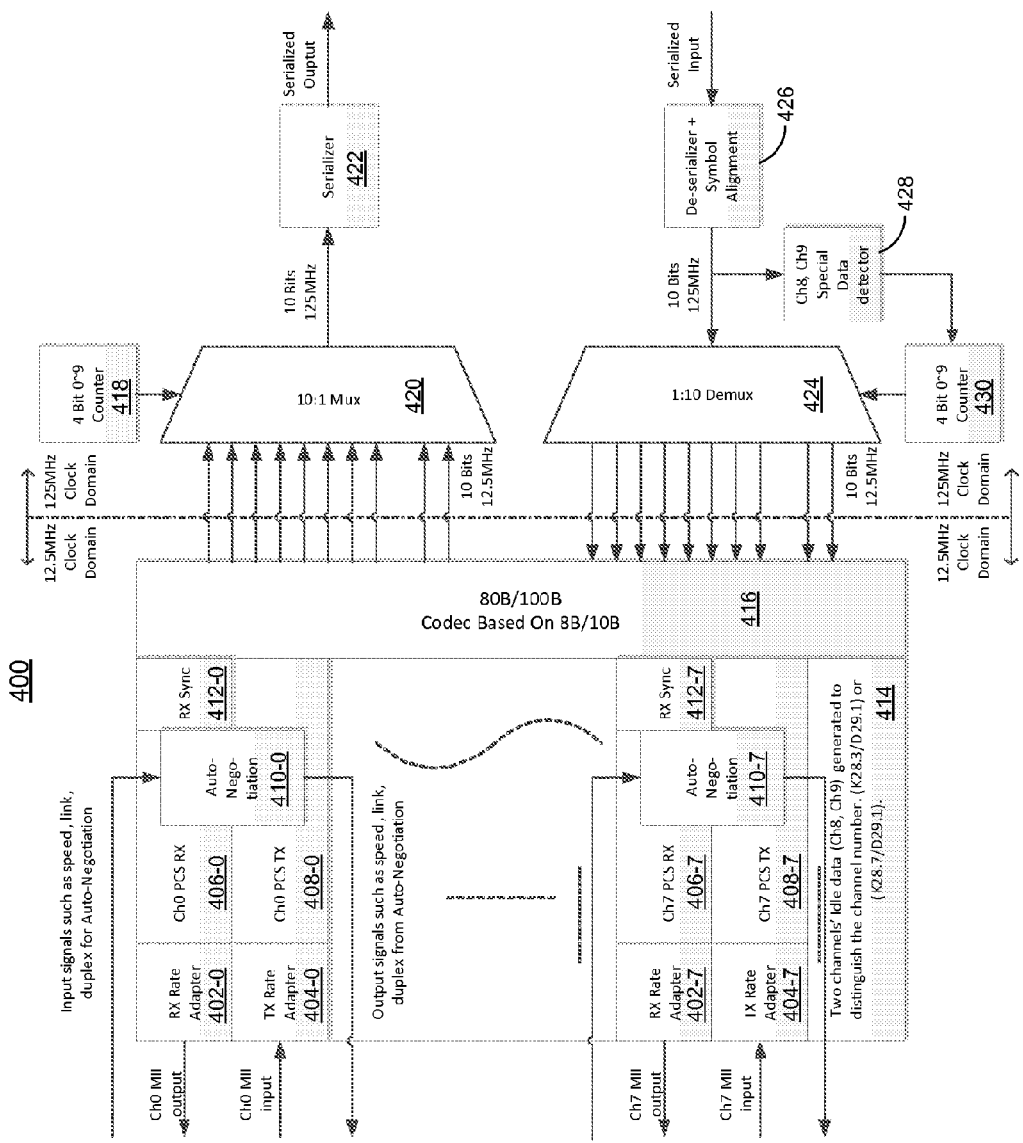
FIG. 4 is a block diagram of a media independent interface that provides a single serial dual-data-rate data path between eight PHY channels and eight MAC sub-layers in accordance with some embodiments.

FIG. 4 illustrates a media independent interface 400 that is an example of media independent interface 370-1 or 370-2 (FIG. 3). The interface 400 includes eight data channels (Ch0 through Ch7), each of which corresponds to a respective port in the transceiver circuitry 340 of PHY 360 and to a respective port of MAC device 350 (FIG. 3). The interface 400 thus links an eight port PHY with an eight port MAC. (More generally, the interface 400 includes a plurality of channels, the number of which may be more than eight or less than eight in other examples.) In some embodiments, each of the eight channels can operate in both half- and full-duplex at both 10/100 Mbps speeds (before 8B/10B encoding). Each of the eight channels thus can be used for either 10 Mbps or 100 Mbps signals (again, before 8B/10B encoding), and PHY 360 thus may be a 10/100 Mbps Ethernet PHY.

In addition, the interface 400 includes two additional channels 414 (Ch8 and Ch9). Special idle indicator symbols (e.g., K28.3 or K28.7 for Ch8 and D29.1 for Ch9) are transmitted from these channels 414 to provide an indication of channel numbers in the serialized output. (More generally, the interface includes one or more additional channels 414 to transmit idle symbols.) For example, the serialized output includes data for channels Ch0-Ch7 in turn (e.g., in round-robin) followed by the idle symbols for Ch8 and Ch9. The receiving interface can identify these idle symbols and use them as markers for channel alignment, to determine which data in the serialized input corresponds to which channels. (Alternatively, predefined symbols on other channels are used for channel alignment, such as K28.1 or K28.5 on Ch0 or Ch4.) In some embodiments, these two channels 414 also operate at 100 Mbps (before 8B/10B encoding). In some embodiments, the idle symbols are selected from known symbols that have not been reserved or used by equipment manufacturers for other purposes. The symbol used for a channel (e.g., whether Ch8 transmits K28.3 or K28.7) may be specified by a register bit.

Each of the eight channels Ch0-Ch7 includes a transmit path and a receive path. For each of Ch0-Ch7, the transmit path receives parallel (e.g., 8-bit wide) signals, including data signals, data valid signals, and error signals, at a transmission rate adapter 404. These signals are processed by a PCS transmit state machine 408 and encoded by an 80B/100B codec 416 (e.g., into 10-bit wide signals). Examples of operation of the 80B/100B codec 416 are described below with regard to FIGS. 6A and 6B. The encoded signals for each channel, and also for Ch8-Ch9, are multiplexed together by a 10:1 multiplexer 420 and serialized by a serializer 422, which drives a serialized output onto a first serial data path (e.g., a first differential pair of the signal paths 380, FIG. 3). Thus, in the example of FIG. 4, eight channels of data and two channels of idle symbols are multiplexed and serialized. In some embodiments, the data and idle symbols for respective channels are output by the 10:1 mux 420 (and thus also by the serializer 422) in round robin order, as determined by a 4-bit 0-9 counter 418 whose output is provided to the mux 420 as a control signal: data is output for Ch0, then Ch1, and so on until Ch9, after which data is output for Ch0 again, and the process repeats. In the example of FIG. 4, the 10:1 mux 420 outputs the 10 bits at 125 MHz and the serializer 422 provides the serialized output at 1.25 Gbps. In some embodiments, the serializer 422 drives the serialized output onto a first differential pair of the signal paths 380 (FIG. 3)

The receive path receives a serialized input, which is de-serialized (e.g., into 10-bit wide signals) by a de-serializer 426 that also performs symbol alignment. In some embodiments, the de-serializer 426 includes CDR circuitry to perform clock and data recovery. In the example of FIG. 4, the de-serializer 426 receives serialized input at 1.25 GHz (e.g., from a second differential pair of the signal paths 380, FIG. 3) and outputs parallel 10-bit wordsat 125 MHz. The parallel 10-bit words are provided to a 1:10 demultiplexer (demux) 424 that demuxes the 10-bit words to respective channels (e.g., to channels Ch0-Ch9 in round-robin fashion). The 10-bit words are also provided to a data detector 428 that detects the special symbols on Ch8 and Ch9 used for channel identification and alignment. The data detector 428 provides a signal to a 4-bit 0-9 counter 430 in response to detection of the symbols on Ch8 and Ch9. The counter 430 accordingly provides its output as a control signal to the 1:10 demux 424. The control signal controls the channels to which the demux 424 provides respective 10-bit words and thus assures that data is provided to the proper channels.

The transmit path of each of Ch0-Ch7 includes a transmission rate adapter 404 (e.g., adapter 404-0 for Ch0 and 404-7 for Ch7). If MII input frames are provided to a channel at a rate less than the maximum possible rate for the channel, the transmission rate adapter 404 elongates the frames by replicating the frames. In the example of FIG. 4, the maximum rate for each channel is 100 Mbps. If 10 Mbps frames are provided to the channel (e.g., the channel corresponds to a 10 Mbps port), the rate adapter 404 replicates each frame 10 times, resulting in a rate of 100 Mbps for the channel. Similarly, the receive path of each of Ch0-Ch7 includes a receiver rate adapter 402 (e.g., adapter 402-0 for Ch0 and 402-7 for Ch7) that reverses the process, and thus allows a 100 Mbps channel to provide 10 Mbps output frames as its MII output.

The MII data in 10 Mbps mode thus is replicated ten times after passing the rate adapter. The Start of Packet (SPD) delimiter (/S/) only appears once per frame. An internal READ_EN signal is used to enable the sampling of data starting at a specified data segment (e.g., the first data segment, or another data segment) once every ten data segments in 10 Mbps mode.

Figure 5:
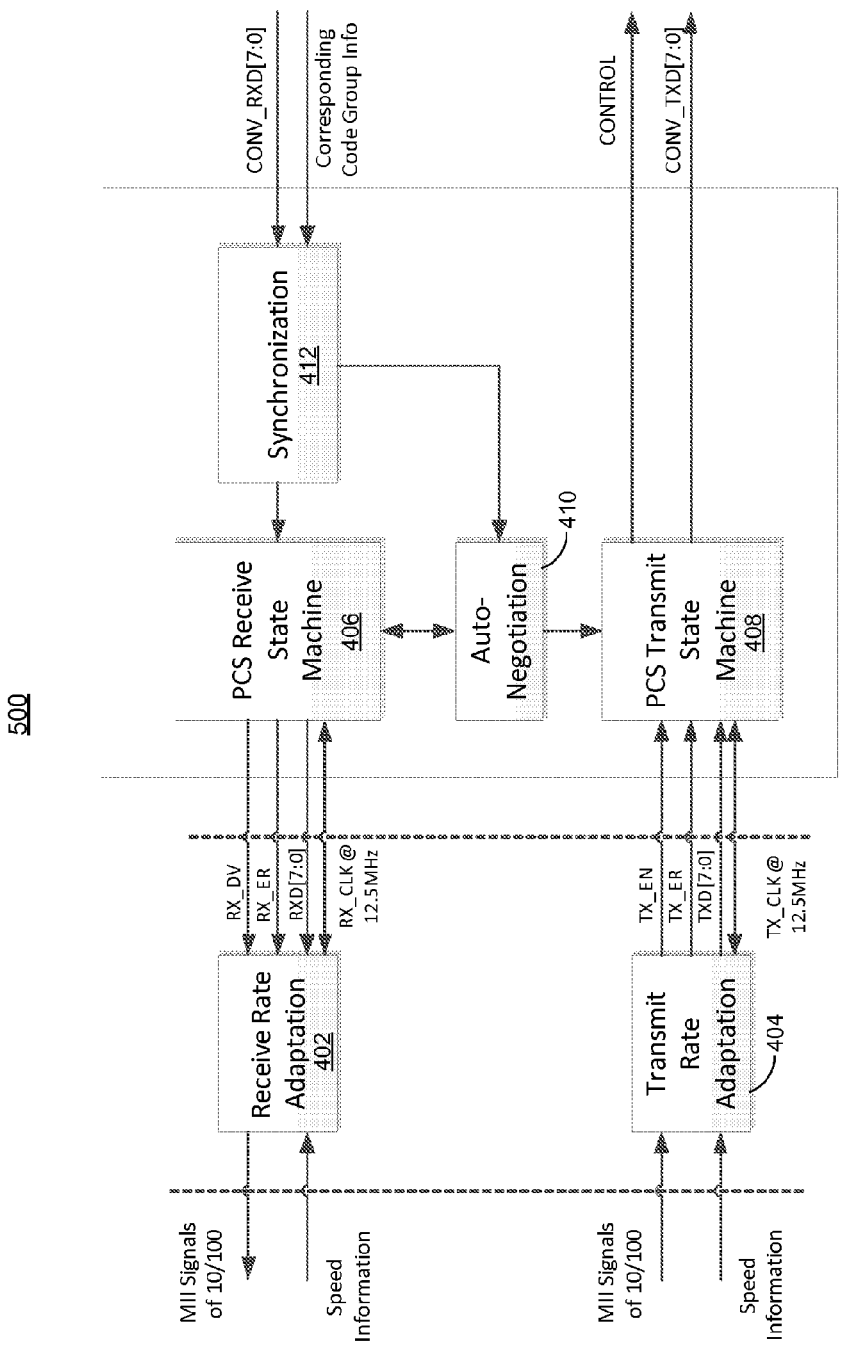
FIG. 5 is a block diagram of a functional block for a channel in the media independent interface of FIG. 4 in accordance with some embodiments.

In the example of FIG. 4, MII signals are received at the transmitter side at 10/100 Mbps and are clocked at 2.5/25 MHz, respectively. These signals pass through the transmission rate adapter 404, which outputs 8-bit data in a 12.5 MHz clock domain. The data then is sent to the PCS Transmit State Machine 408, as shown in FIG. 5, to generate replaced 8-bit data with a corresponding control bit for encoding later. In some embodiments, to ensure proper functioning of the PCS layer, MII frames begin with at least two preamble symbols followed by a SFD symbol. In the receive path, 8-bit data and corresponding code group information is received from the 80B/100B codec 416 in the 12.5 MHz clock domain. This data and information is processed by the synchronization block 412 and PCS Receive State Machine 406. The synchronization block 412 checks the code group information to determine the synchronization status between link partners and to re-align if it detects that the synchronization is lost. The PCS Receive State Machine 406 recovers the MII signals and provides the recovered MII signals to the receive rate adapter 402, which outputs the signals at 10 or 100 Mbps (e.g., according to the corresponding port speed information).

According to the assertion and deassertion of RX_DV, the transmitter encodes the Start_of_Packet delimiter (SPD /S/) and the End_of_Packet (EPD /T/) to signal the beginning and end of each packet. The receiver side recovers the RX_DV signal by detecting these two delimiters. The transmitter encodes an Error_Propagation (/V/) ordered set to indicate a data transmission error. The receiver side asserts RX_ER signal whenever it detects this ordered set. CRS and COL are not directly encoded but generated on the receiver side using RX_DV and TX_EN.

The transmit PCS circuitry of each of Ch0-Ch7 includes PCS circuitry (e.g., the PCS transmit state machine 408) that converts MII packets (including, for example, traditional MII data signals, data valid signals, and error signals) to data compatible with 8B/10B encoding (e.g., 8-bit packet data and a corresponding control bit k). This data is provided to the 80B/100B codec 416 for encoding. Likewise, the receive PCS circuitry of Ch0-Ch7 includes PCS circuitry (e.g., the PCS receive state machine 406) that converts decoded data from the 80B/100B codec 416, as synchronized by the receive synchronization block 412, to MII packets that are then provided to the receive rate adapter 402. In some embodiments, the transmit and receive data paths leverage the 1000BASE-X PCS defined in the IEEE802.3z specification (clause 36).

In some embodiments, to align with QSGMII, the use of K28.5 on channel 0 and channel 4 is replaced with K28.1. This may be done on eight bits rather than ten bits. Whether K28.1 or K28.5 is used may be controlled by a register. The receive path may be configured to treat K28.1 and K28.5 identically. There are several options to not use the K28.1 swapper, which the interface 400 does not rely on for channel indication in accordance with some embodiments. For example, two dedicated control bits can control whether swapping is performed.

With regard to encoding, IEEE 802.3z provides rules for handling running disparity by sending out one of the two IDLE order sets, referred to as /IV and /I2/. In the interface 400, however, since the 80B/100B encoder 416 is detached from the function of the PCS transmit state machine 408, only /I1/ ordered sets are generated in some embodiments. Also, due to the nature of 80B/100B encoding, bit errors on the link may cause a running disparity error to propagate across ports. Disparity checks that rely on the running disparity value from the previous symbol are therefore disabled in accordance with some embodiments.

After frame elongation, the data rate of each of Ch0-Ch7 is 100 Mbps. After encoding this data rate increases to 125 Mbps, resulting in a total data rate of 1 Gbps. The two channels 414 (Ch8 and Ch9) that transmit special idle symbols as an indication of channel numbers use another 0.25 Gbps (i.e., a 25% overhead), resulting in a total data rate for all channels combined of 1.25 Gbps. The serialized output thus has a data rate of 1.25 Gbps in some embodiments. More generally, the serialized output has a data rate equal to the data rate of all channels combined after encoding, including the data rates of channels transmitting idle symbols.

The interface 400 may be configured in PHY mode or MAC mode, depending on whether it is situated in PHY 360 or MAC device 350 (FIG. 3). Auto-negotiation circuitry 410 (e.g., including circuitry 410-0 for Ch0 and 410-7 for Ch7) is used to specify the mode. Control information (e.g., as specified in Table 1 below) is transferred from PHY 360 to MAC device 350 (e.g., in response to a change of the control information). In some embodiments, this is achieved by leveraging the auto-negotiation mechanism defined in 802.3z clause 37. In some embodiments, the link-timer inside the auto-negotiation mechanism 410 has been changed from 10 ms to 1.6 ms to ensure a prompt update of the link status.

The interface 400 in MAC device 350 thus follows auto-negotiation results between the local PHY 360 (e.g., the local copper PHY) and a remote PHY (e.g., a remote copper PHY). The local PHY 360 updates the control information when the link status has changed. If the local PHY 360 detects a link change, it starts its corresponding auto-negotiation mechanism 410, configures the corresponding channel from a "data" state to a "configuration" state, and sends out the updated control information by transmitting the values of configuration register tx_config_reg[15:0] to MAC device 350. The receive path of the corresponding channel on the MAC 350 side receives and decodes the control information, and starts the MAC's auto-negotiation mechanism 410. The MAC 350 side acknowledges the update of link status by asserting bit 14 of tx_config_reg and transmitting tx_config_reg via the channel's transmit path to the local PHY 360. Upon receiving the acknowledgement from MAC 350, PHY 360 completes the auto-negotiation process and returns to the "data" state (e.g., to normal data transmission and reception). In some embodiments, the expected latency of the update of link status corresponds to two link_timer times and the acknowledgement process time (e.g., for a total of 3.4 ms).

In some embodiments, instead of performing ability advertisement, the auto-negotiation circuit 410 in PHY 360 sends to the auto-negotiation circuit 410 in MAC device 350 the control information (e.g., obtained from copper PHY/MAC configuration) specified in its tx_config_reg[15:0], as shown in Table 1, whenever the control information changes. Upon receiving the updated information, the auto-negotiation circuit 410 in MAC device 350 performs an acknowledgment by asserting bit 14 of its own tx_config_reg as specified in Table 1 and transmitting its tx_config_reg to PHY 360 in response. Transmitted information includes the link status, duplex mode, and speed.

TABLE 1

| | Definition of control information in tx_config_reg[15:0] | |
|---|---|---|
| Bit Number | Tx_config_reg[15:0] sent from the PHY to the MAC | Tx_config_reg[15:0] sent from the MAC to the PHY |
| 15 | Link: 1 = link up, 0 = link down | 0: reserved for future use |
| 14 | Reserved for Auto-Negotiation acknowledge as specified in 802.3z | 1 |
| 13 | 0: reserved for future use | 0: reserved for future use |
| 12 | Duplex mode: 1 = full duplex, 0 = half duplex | 0: reserved for future use |
| 11:10 | Speed: bit 11, 10:<br>11: Reserved<br>01 = 100 Mbps: 100BASE-TX, 100BASE-FX<br>00 = 10 Mbps: 10BASET, 10BASE2, 10BASE5<br>10 = 1 Gbps: 1000BASE-T, etc. | 0: reserved for future use |
| 9:1 | 0: reserved for future use | 0: reserved for future use |
| 0 | 1 | 1 |

In some embodiments, the interface 400 supports IEEE 802.3az low-power idle flow between PHY 360 and MAC device 350, and thus Energy Efficient Ethernet (EEE) low power mode for PHY 360 and MAC device 350. For example, the transmit PCS state machine 408 applies a special code group for LPI idle to support the transparent flow of LPI signals between MAC device 350 and PHY 360.

By multiplexing all eight data channels into a single SerDes (e.g., the combination of serializer 422 and de-serializer 426) operating at 1.25 Gbps, the interface 400 (including the functional blocks of FIG. 5) uses less power and produces less EMI than other octal-channel MII solutions. For example, octal QSGMII would require two SerDes, including one SerDes for each group of four channels, with each SerDes operating at 5 Gbps. Octal SGMII would require eight SerDes, one for each channel. The interface 400 also uses fewer pins than other solutions: it uses only four pins (2 for each serial data path), as opposed to eight pins for octal QSGMII and 20 pins for octal S3MII. (The term pin as used herein includes solder balls, lands, and any other structures used to electrically connect a semiconductor package to a circuit board.) Unlike S3MII, the interface 400 is not source-synchronous; it uses CDR technology for clock and data recovery. The interface 400 also allows for reasonable trace lengths (e.g., up to 3 ns/45 cm traces for the data path in some embodiments) and simple/low-cost board design (e.g., two-layer boards in some embodiments). Furthermore, the interface 400 may be easily extended for additional channels.

FIG. 5 is a block diagram of a functional block for one channel in the media independent interface 400 in accordance with some embodiments. The circuitry shown in FIG. 5 corresponds to the circuitry shown in the 12.5 MHz clock domain and prior to the 80B/100B codec in FIG. 4.

Figure 6A:
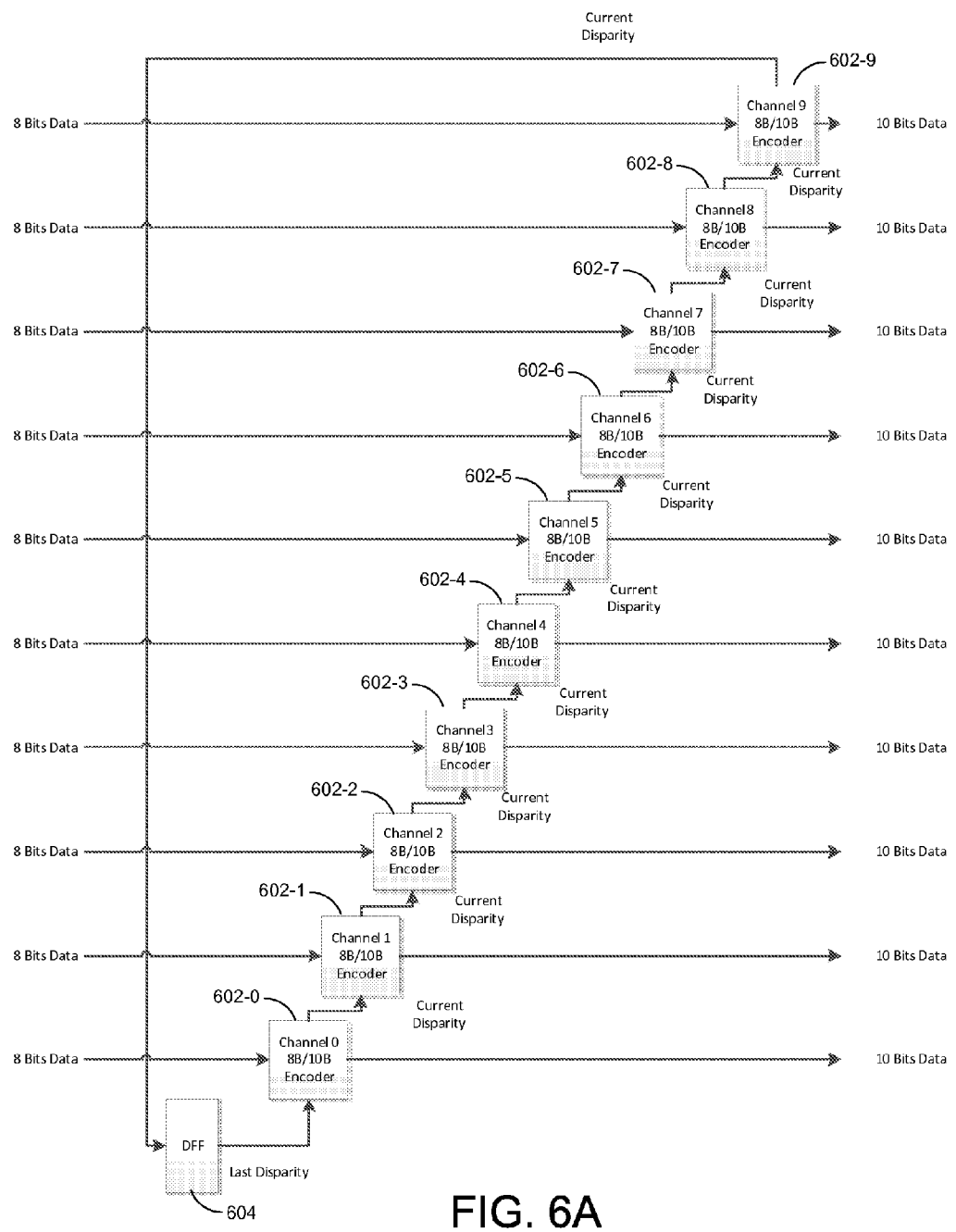
FIG. 6A is a block diagram illustrating a running disparity scheme for encoding data in the media independent interface of FIG. 4 in accordance with some embodiments.

FIG. 6A is a block diagram illustrating a running disparity scheme 600 for encoding data in the media independent interface 400 in accordance with some embodiments. The running disparity scheme 600 is used in some embodiments of the 80B/100B codec 416 (FIG. 4). For each of the ten channels Ch0-Ch9, 8 bits of data (e.g., an 8-bit wide data word) are provided to an 8B/10B encoder 602: 8 bits of data for Ch0 are provided to a first encoder 602-0, 8 bits of data for Ch1 are provided to a second encoder 602-1, and so on. While FIG. 6A shows a separate 8B/10B encoder 602 for each channel, in some embodiments the same 8B/10B encoder 602 is used for all channels, with appropriate storage of state information for each channel. The disparity for a respective channel is provided to the next channel for use in encoding the next channel, and thus represents a running disparity. For example, the disparity for Ch0 is provided to the Ch1 encoder 602-1, the disparity for Ch1 is provided to the Ch2 encoder 602-2, and so on, with the disparity for Ch9 being provided to the Ch0 encoder 602-0 (e.g., via a flip-flop 604). The disparity of the last channel (e.g., Ch9) thus is provided to the encoder for the first channel (e.g., Ch0). Disparity indicates whether the data has more 1's than 0's (e.g., as indicated by a disparity value of '1') or more 0's than 1's (e.g., as indicated by a disparity value of '0').

Figure 6B:
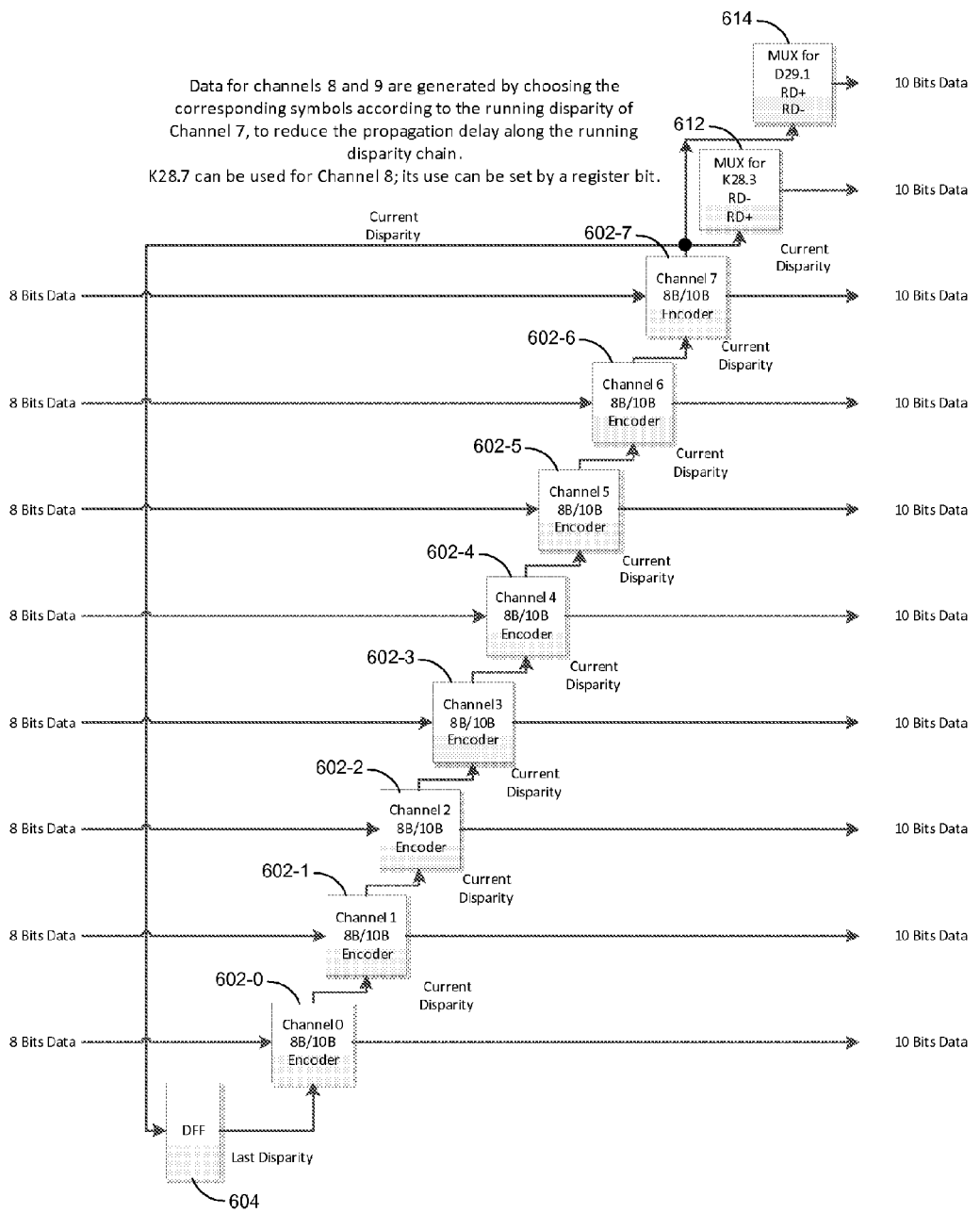
FIG. 6B is a block diagram illustrating another running disparity scheme for encoding data in the media independent interface of FIG. 4 in accordance with some embodiments.

FIG. 6B is a block diagram illustrating another running disparity scheme 610 for encoding data in the media independent interface 400 in accordance with some embodiments. The running disparity scheme 610 is used in some embodiments of the codec 416 (FIG. 4). For each of the eight data channels Ch0-Ch7, 8 bits of data (e.g., an 8-bit wide data word) are provided to an 8B/10B encoder 602: 8 bits of data for Ch0 are provided to a first encoder 602-0, 8 bits of data for Ch1 are provided to a second encoder 602-1, and so on. The encoders 602-0 through 602-7 compose a 64B/80B encoder for the eight data channels Ch0-Ch7. While FIG. 6A shows a separate 8B/10B encoder 602 for each data channel, in some embodiments the same 8B/10B encoder 602 is used for all channels, with appropriate storage of state information for each channel. The disparity for a respective data channel is provided to the next data channel for use in encoding the next data channel. (The term data channel refers to Chs0-7 in this example and not to Chs8-9, which do not transmit MII data but instead transmit idle symbols for channel identification and alignment.) For example, the disparity for Ch0 is provided to the Ch1 encoder 602-1, the disparity for Ch1 is provided to the Ch2 encoder 602-2, and so on, with the disparity for Ch7 being provided to the Ch0 encoder 602-0 (e.g., via a flip-flop 604). The disparity of the last data channel (e.g., Ch7) thus is provided to the encoder for the first data channel (e.g., Ch0). The disparity of the last data channel (e.g., Ch7) also is provided to multiplexers 612 and 614 for Ch8 and Ch9. The data for Ch8 and Ch9 thus are generated by choosing corresponding symbols according to the running disparity from Ch7: the multiplexers 612 and 614 choose output symbol for Ch8 and Ch9 to match the running disparity from Ch7. This reduces the propagation delay along the running disparity chain as compared to FIG. 6A and simplifies design, while assuring that the disparity is corrected when data for all of channels Ch0-Ch9 are muxed together. In some embodiments, the available idle symbols associated with one or both of Ch8 and Ch9 can be specified by a register setting. For example, Ch8 is shown in FIG. 6B as transmitting K28.3, but can be configured (e.g., by setting a register bit) to transmit another symbol (e.g., K28.7). Idle symbols are chosen to allow proper alignment of symbol boundaries.

In some embodiments, a media independent interface such as the interface 400 (FIG. 4) is configurable to operate in multiple modes corresponding, for example, to multiple respective protocols. For example, an MII may be configured to operate as described with regard to FIGS. 4-6B in a first mode. In a second mode, the same MII is configured to operate in accordance with the QSGMII protocol. For example, serialized data for a first group of four channels (e.g., Ch0-Ch3) is transmitted and received over a first serial data path and serialized data for a second group of four channels (e.g., Ch4-Ch7) is transmitted and received over a second serial data path. In a third mode, the same MII is configured to operate in accordance with the SGMII protocol. For example, serialized data for each of (or a subset of) the data channels (e.g., Ch0-Ch7 or a subset thereof) is transmitted and received over a respective serial data path. In some embodiments, each serial data path includes a first differential pair (e.g., a low-voltage differential signaling pair) for transmitting data and a second differential pair (e.g., a low-voltage differential signaling pair) for receiving data. In some embodiments, the mode is set using one or more mode bits in a configuration register coupled to the interface (e.g., a configuration register 740, as illustrated in FIGS. 7B-7C).

In some embodiments, an interface (e.g., interface 700, FIG. 7A, below) is configurable in different modes as a single interface 400 (FIG. 4), a single QSGMII interface, a dual QSGMII interface, a single QSGMII interface and 1-4 SGMII interfaces, and 1-8 SGMII interfaces.

Figure 7A:
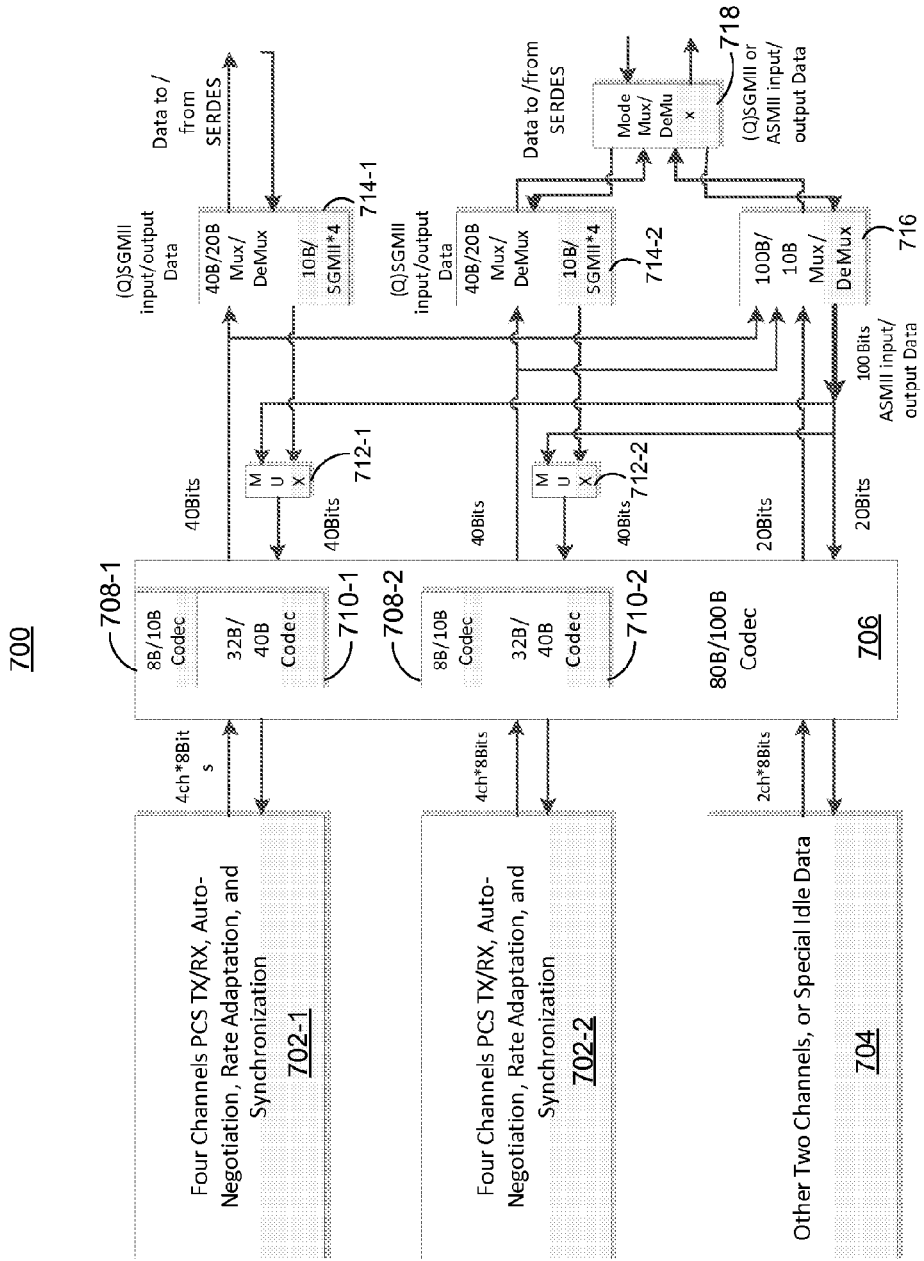
FIG. 7A is a block diagram of a mode-configurable media independent interface in accordance with some embodiments.
Figure 7B:
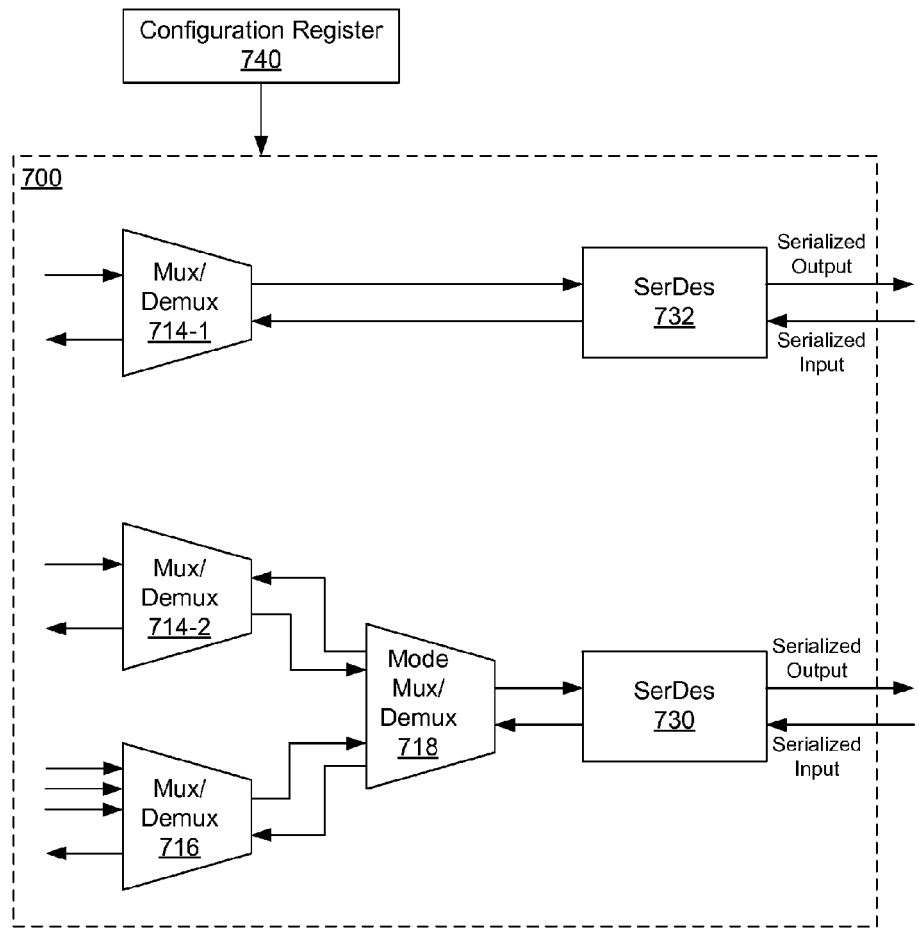
FIGS. 7B and 7C are block diagrams of portions of mode-configurable media independent interfaces, including the serializers/deserializers (Serdes) of the interfaces, in accordance with some embodiments.
Figure 7C:
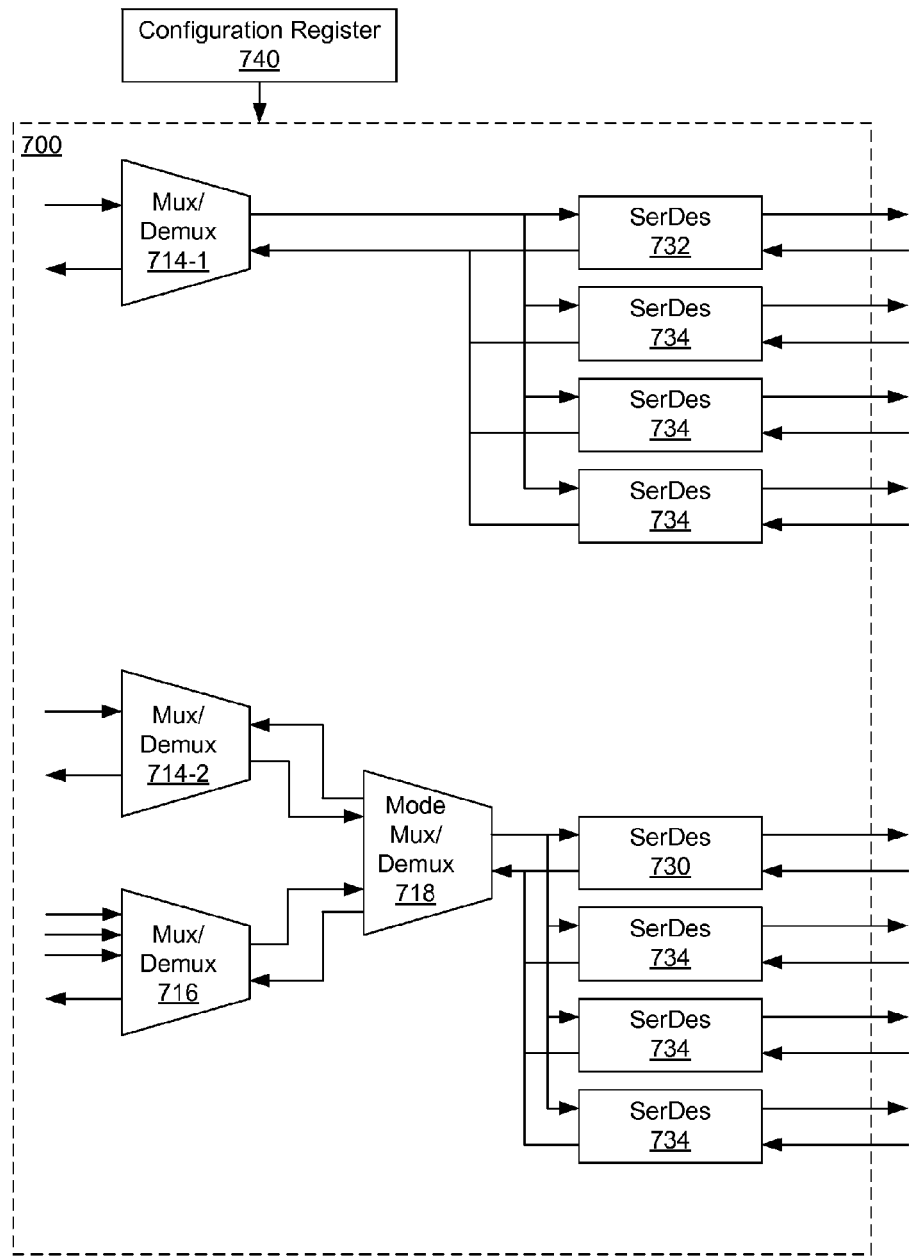

FIG. 7A is a block diagram of a mode-configurable media independent interface 700 in accordance with some embodiments. The MII 700 includes functional blocks 702-1 for a first group of four data channels (Ch0-Ch3), functional blocks 702-2 for a second group of four data channels (Ch4-Ch7), and functional blocks 704 for an additional two channels (Ch8-Ch9) used for transmitting and receiving idle symbols for channel identification and alignment. (Alternatively, one or both of the additional two channels are additional data channels).

In the first mode, which corresponds to the interface 400 (FIG. 4), transmit data for the eight channels Ch0-Ch7 are provided by the functional blocks 702-1 and 702-2 to the 80B/100B codec 706, which encodes the data. Idle symbols for Ch8 and Ch9 are provided by the functional block 704 to the 80B/100B codec 706, which encodes them as well. The encoded data (including idle symbols), including 40 bits for Ch0-Ch3, 40 bits for Ch4-Ch7, and 20 bits for Ch8-Ch9, are provided to 100B/10B mux/demux 716, which corresponds to the combination of mux 420 and demux 424 (FIG. 4). (Muxes/demuxes 714-1 and 714-2 also receive the respective encoded data for Ch0-Ch3 and Ch4-Ch7 but are disabled in the first mode.) Mux/demux 716 is configured in the first mode to forward the encoded 10-bit-wide data for each of Ch0-Ch9 in turn to mode mux/demux 718. Mode mux/demux 718 is configured in the first mode to forward data from the 100B/10B mux/demux 716 to a first SerDes 730, as illustrated in FIG. 7B in accordance with some embodiments. The first SerDes 730 serializes the data and transmits the data onto a first serial data path. A second SerDes 732 (FIG. 7B), coupled to the mux/demux 714-1, is disabled in the first mode.

Also in the first mode, serialized receive data (including idle symbols) for the ten channels Ch0-Ch9 is received at the first SerDes 730 (FIG. 7B), which deserializes the data and forwards the deserialized 10-bit-wide data to the mode mux/demux 718. The mode mux/demux 718 is configured in the first mode to forward the deserialized data to 100B/10B mux/demux 716, which is configured in the first mode to demux the deserialized data and forward the demuxed 100-bit-wide data. (Data detector 428 and counter 430, which are not shown in FIG. 7A for simplicity, function as described with regard to FIG. 4.) Muxes 712-1 and 712-2, which have first inputs coupled to the 100B/10B mux/demux 716, are configured in the first mode to forward data from the 100B/10B mux/demux 716 to the codec 706. The 100B/10B mux/demux 716 also forwards the encoded idle symbols for Ch8 and Ch9 to the codec 706. The codec 706 decodes the data. The decoded data and idle symbols are provided to the functional blocks 702-1, 702-2, and 704.

In the first mode, data communicated between the codec 706 and the mux/demux 716 thus have a first width (e.g., 100 bits wide) and data communicated between the mux/demux 716 and the first SerDes 730 (FIG. 7B) have a second width (e.g., 10 bits wide). The mux/demux 716 multiplexes the data of the first width (e.g., 100-bit-wide data) into data of the second width (e.g., 10-bit-wide data) and demultiplexes data of the second width (e.g., 10-bit-wide data) into data of the first width (e.g., 100-bit-wide data).

In some embodiments, the first SerDes 730 (FIG. 7B) operates at 1.25 GBps in the first mode; the mux/demux 718 operates at 125 MHz in the first mode; and the functional blocks 702-1, 702-2, and 704, codec 706, and muxes 712-1 and 712-2 operate at 12.5 MHz. The inputs and output of the mux/demux 716 that are coupled to the codec 706 operate at 12.5 MHz while the input and output of the mux/demux 716 that are coupled to the mode mux/demux 718 operate at 125 MHz. In some embodiments, these clocks are provided by configurable clock generation logic.

In the second mode, which in some embodiments corresponds to the QSGMII protocol, transmit data for the eight channels Ch0-Ch7 are provided by the functional blocks 702-1 and 702-2 to the codec 706, which encodes the data. For example, a first 32B/40B codec 710-1 in the codec 706 encodes the transmit data for Ch0-3 and a second 32B/40B codec 710-2 in the codec 706 encodes the transmit data for Ch4-7. The encoded data (e.g., 40 bits) for Ch0-Ch3 are provided to 40B/20B mux/demux 714-1 and the encoded data (e.g., 40 bits) for Ch4-Ch7 are provided to 40B/20B mux/demux 714-2. (100B/10B Mux/Demux 716 also receives the encoded data for Ch0-Ch7 but is disabled in the second mode.) Mux/demux 714-2 is configured in the second mode to forward the encoded data for Ch4-Ch7 to mode mux/demux 718, which is configured in the second mode to forward the encoded data for Ch4-Ch7 to the first SerDes 730 (FIG. 7B), which serializes the data and transmits the data onto a first serial data path. Mux/demux 714-1 is configured in the second mode to forward the encoded data for Ch0-Ch3 to the second SerDes 732 (FIG. 7B), which serializes the data and transmits the data onto a second serial data path.

Also in the second mode, serialized receive data for Ch4-Ch7 is received at the first SerDes 730 (FIG. 7B), which deserializes the data and forwards the deserialized data to the mode mux/demux 718. The mode mux/demux 718 is configured in the second mode to forward the deserialized data to 40B/20B mux/demux 714-2. The mode mux/demux 718 thus couples the mux/demux 714-2 with the first SerDes 730 (FIG. 7B) in the second mode and couples the mux/demux 716 with the first SerDes 730 (FIG. 7B) in the first mode.

Serialized receive data for Ch0-Ch3 is received at the second SerDes 732 (FIG. 7B), which deserializes the data and forwards the deserialized data to the 40B/20B mux/demux 714-1. 40B/20B muxes/demuxes 714-1 and 714-2 forward the data to respective second inputs of muxes 712-1 and 712-2. Muxes 712-1 and 712-2 are configured in the second mode to forward data from the 40B/20B muxes/demuxes 714-1 and 714-2 to the codec 706. The codec 706 decodes the data: for example, the first 32B/40B codec 710-1 in the codec 706 decodes the receive data for Ch0-3 and the second 32B/40B codec 710-2 in the codec 706 decodes the receive data for Ch4-7. The decoded data are provided to the functional blocks 702-1 and 702-2.

In the second mode, data communicated between the codec 706 and the muxes/demuxes 714-1 and 714-2 thus have a third width (e.g., 40 bits wide) and data communicated between the muxes/demuxes 714-1 and 714-2 and the first and second SerDes 730 and 732 (FIG. 7B) have a fourth width (e.g., 20 bits wide). The muxes/demuxes 714-1 and 714-2 multiplex the data of the third width (e.g., 40-bit-wide data) into data of the fourth width (e.g., 20-bit-wide data) and de-multiplex data of the fourth width (e.g., 20-bit-wide data) into data of the third width (e.g., 40-bit-wide data).

In some embodiments, Ch8 and Ch9 are disabled in the second mode. In some embodiments, the first channel of each group of four channels (e.g., Ch0 and Ch4) applies the K28.1 swapper symbol (which may be disabled in the first mode.)

In some embodiments, a group of four channels (e.g., Ch0-3 or Ch4-7) is disabled in the second mode. The corresponding functional block 702-1 or 702-2 and SerDes (e.g., the first or second SerDes 730 or 732, FIG. 7B) is disabled, along with the circuitry coupling the disabled functional block with the disabled SerDes. For example, the interface 700 is configured to act as a single QSGMII interface for four channels.

In some embodiments, the first and second SerDes 730 and 732 (FIG. 7B) operate at 5 Gbps in the second mode. The first SerDes 730 thus is configurable to operate at multiple speeds (e.g., at 1.25 Gbps in the first mode and 5 Gbps in the second mode). The functional blocks 702-1, 702-2, and 704, codec 706, and muxes 712-1 and 712-2 operate at 125 MHz. The inputs and outputs of the muxes/demuxes 714-1 and 714-2 that are coupled to the codec 706 operate at 125 MHz while the inputs and outputs of the muxes/demuxes 714-1 and 714-2 that are coupled to the first or second SerDes 730 or 732 operate at 250 MHz. Thus, communications between the codec 706 and muxes/demuxes 714-1 and 714-2 are 40 bits wide while communications between the muxes/demuxes 714-1 and 714-2 and the SerDes 730 and 732 are 20 bits wide but at twice the clock rate in accordance with some embodiments.

In the third mode, which in some embodiments corresponds to the SGMII protocol, data for respective channels are transmitted and received via respective serial data paths, such that each serial data path corresponds to a particular channel. Transmit data for the eight channels Ch0-Ch7 are provided by the functional blocks 702-1 and 702-2 to the codec 706, which encodes the data. For example, a separate 8B/10B codec (e.g., including codecs 708-1 and 708-2) in the codec 706 encodes the transmit data for each of Ch0-Ch7. The encoded data (e.g., 40 bits) for Ch0-Ch3 is provided to 40B/20B mux/demux 714-1 and the encoded data (e.g., 40 bits) for Ch4-Ch7 is provided to 40B/20B mux/demux 714-2. In the third mode, muxes/demuxes 714-1 and 714-2 are configured to pass through 10-bit data for each of the channels (e.g., as indicated by the notation 10B/SGMII*4 in FIG. 7A, indicating the pass-through of 10 bits for each of four SGMII channels). Each of the muxes/demuxes 714-1 and 714-2 is coupled to four SerDes and is configured to pass through 10-bit data for respective channels to respective SerDes, as illustrated in FIG. 7C in accordance with some embodiments. For example, mux/demux 714-2 is coupled to the first SerDes 730 and three other SerDes 734, and mux/demux 714-1 is coupled to the second SerDes 732 and three other SerDes 734. (The second SerDes 732 and all of the SerDes 734 are disabled in the first mode, and all of the SerDes 734 are disabled in the second mode.)

In some embodiments, 100B/10B Mux/Demux 716 is disabled in the third mode. Mux/demux 714-2 is coupled to its four SerDes 730 and 734 via mode mux/demux 718, which is configured in the third mode to forward the encoded data for Ch4-Ch7 to these four SerDes. Each SerDes serializes the data for its respective channel and transmits the data onto a respective serial data path.

Also in the third mode, serialized receive data for respective channels are received at respective SerDes 730, 732, and/or 734 (FIG. 7C), which deserialize the data and forward the deserialized data to muxes/demuxes 714-1 and 714-2. For the mux/demux 714-2, deserialized data is forwarded via the mode mux/demux 718, which is configured in the third mode to forward the deserialized data to mux/demux 714-2 and not to mux/demux 716. Muxes 712-1 and 712-2 are configured in the third mode to forward data from the muxes/demuxes 714-1 and 714-2 to the codec 706. The codec 706 decodes the data: for example, separate 8B/10B codecs (e.g., including codecs 708-1 and 708-2) in the codec 706 decode the receive data for each of Ch0-Ch7. The decoded data are provided to the functional blocks 702-1 and 702-2.

In some embodiments, Ch8 and Ch9 are disabled in the third mode.

In some embodiments, the first and second SerDes 730 and 732 (FIG. 7C) operate at 1.25 Gbps in the third mode. The second SerDes 732 thus is configurable to operate at multiple speeds (e.g., at 1.25 Gbps in the third mode and 5 Gbps in the second mode). The first SerDes 730 also is configurable to operate at multiple speeds (e.g., as discussed above). The other SerDes 734, however, are only used in the third mode and thus in some embodiments are not configurable to operate at multiple speeds (e.g., they only operate at 1.25 Gbps). The functional blocks 702-1, 702-2, and 704, codec 706, muxes 712-1 and 712-2, and muxes/demuxes 714-1 and 714-2 operate, for example, at 125 MHz. The functional blocks 702-1, 702-2, and 704 and codec 706 thus are configurable to operate at multiple clock rates (e.g., 12.5 MHz in the first mode and 125 MHz in the second and third modes) in accordance with some embodiments.

In some embodiments, the interface 700 is configurable in a fourth mode that combines the second and third modes. Four channels (e.g., Ch0-3 or Ch4-7) are configured in the second mode, and all or a portion of the remaining channels are configured in the third mode. For example, the interface 700 is configurable in the fourth mode to act as a single QSGMII interface and 1-4 SGMII interfaces.

Figure 8:
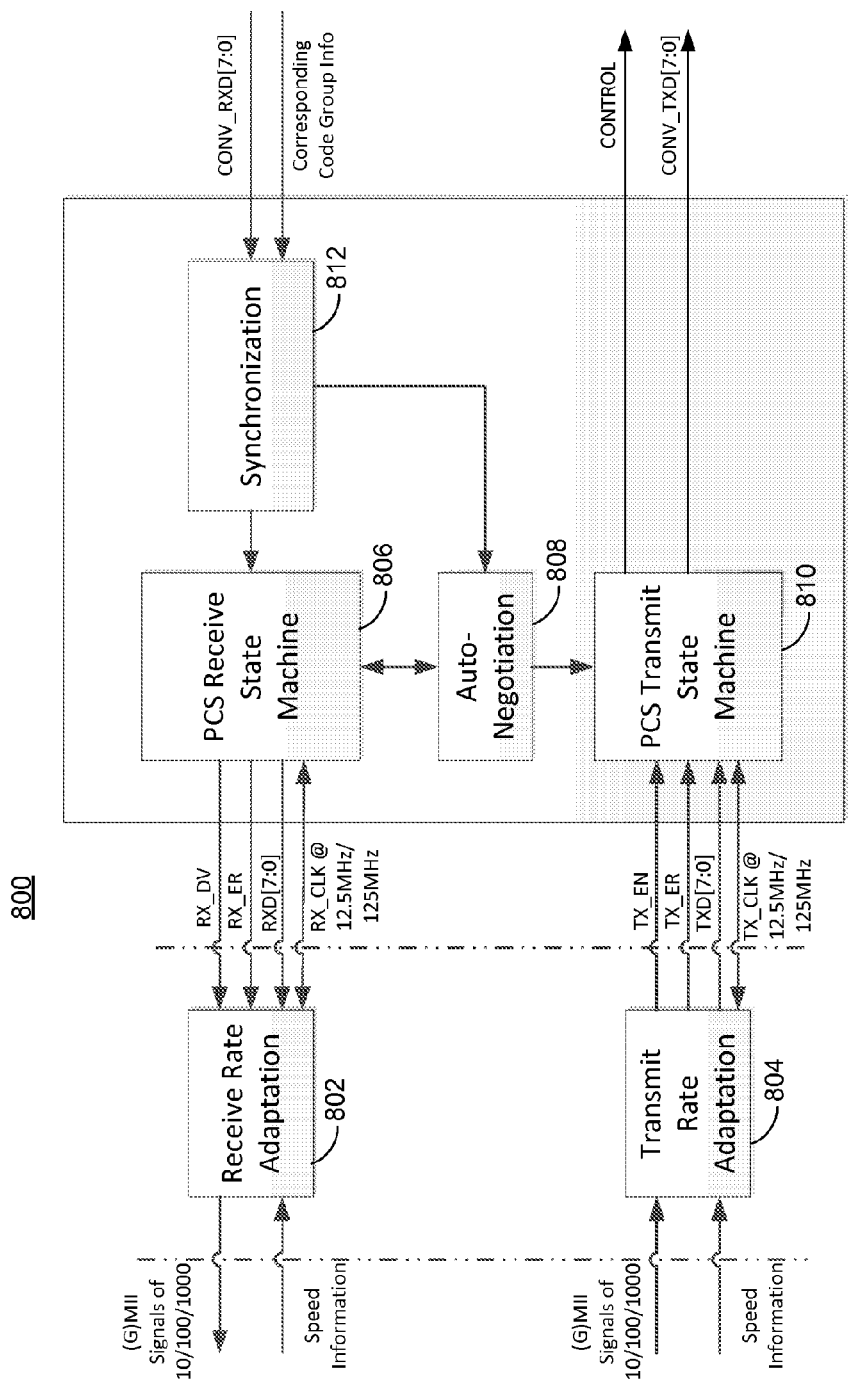
FIG. 8 is a block diagram of a functional block for a channel in the media independent interface of FIG. 7A in accordance with some embodiments.

FIG. 8 is a block diagram of a functional block 800 for a channel in the media independent interface of FIG. 7A in accordance with some embodiments. The elements of the functional block 800 function as described for the corresponding elements of FIGS. 4 and 5, but are configurable to operate at multiple clock rates. For example, the receive rate adapter 802, transmit rate adapter 804, PCS receive state machine 806, auto-negotiation circuit 808, PCS transmit state machine 810, and synchronization block 812 are configurable to operate with a first working clock (e.g., 12.5 MHz) in the first mode and a second working clock (e.g., 125 MHz) in the second and/or third modes. In a given mode, the receive rate adaptation block 802 and transmit rate adaptation block 804 perform rate adaptation for signals that are slower than the maximum rate that can be accommodated in that mode. This maximum rate can change, however, from mode to mode. In one example, a channel in the first mode can accommodate signals of 10 Mbps or 100 Mbps. The transmit rate adapter 802 elongates 10 Mbps frames provided as input signals by replicating the frames, but does not elongate 100 Mbps frames. In the second and third modes, however, the channel can accommodate signals of 10 Mbps, 100 Mbps, or 1 Gbps. The transmit rate adapter 804 elongates 10 or 100 Mbps frames provided as input signals by replicating the frames, but does not elongate 1 Gbps frames. Frames of a given rate (e.g., 100 Mbps) thus may be elongated in one mode (e.g., the second or third mode) but not in another mode (e.g., the first mode). Similarly, the receive rate adapter 802 shortens output frames for 10 Mbps outputs but not for 100 Mbps outputs in the first mode, and shortens output frames for 10 or 100 Mbps outputs but not for 1 Gbps outputs in the second and third modes. Frames of a given rate thus may be shortened in one mode (e.g., the second or third mode) but not in another mode (e.g., the first mode).

Figure 9:
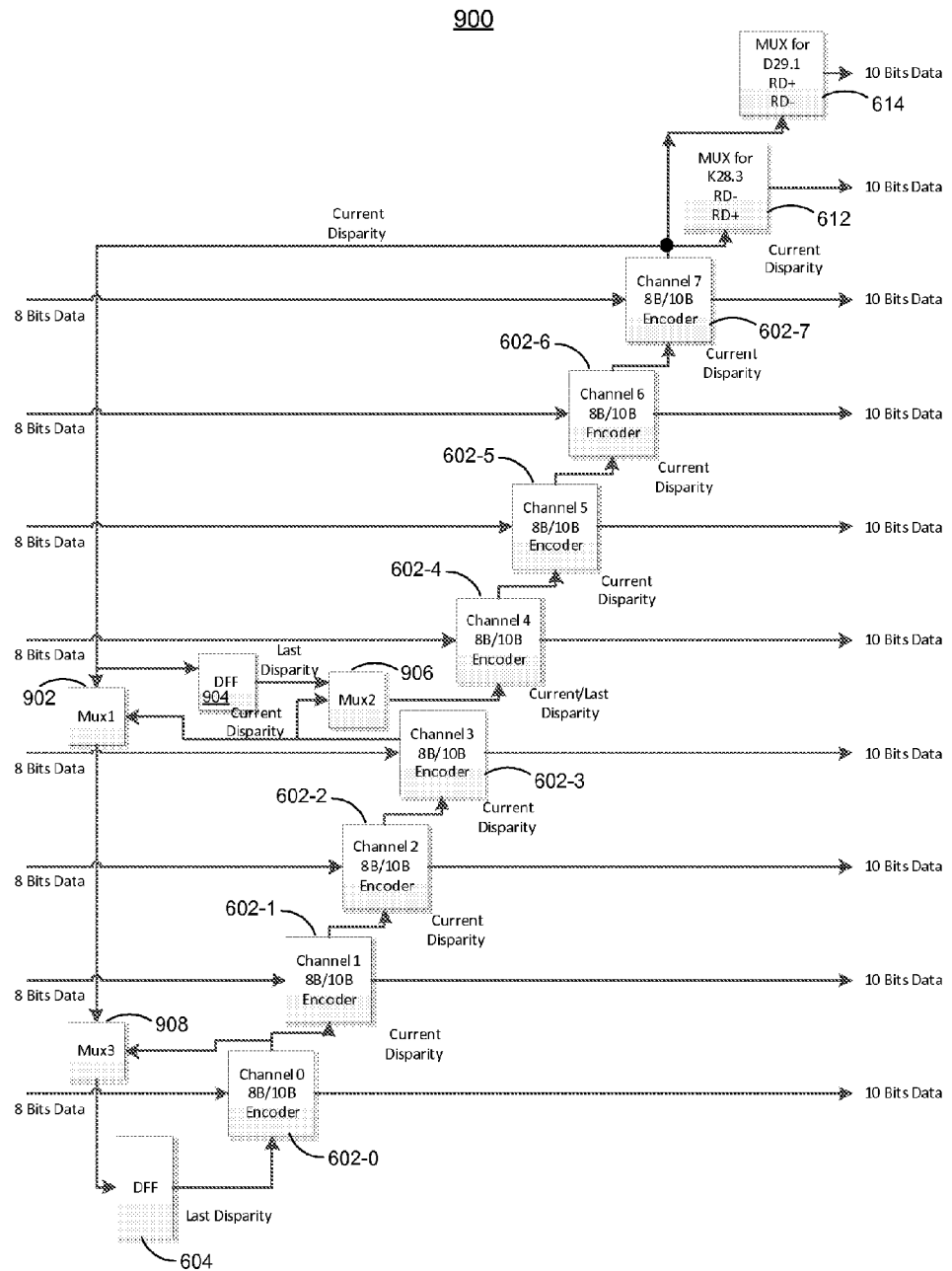
FIG. 9 is a block diagram illustrating a running disparity scheme for encoding data in the media independent interface of FIG. 7A in accordance with some embodiments.

FIG. 9 is a block diagram illustrating a configurable running disparity scheme 900 for encoding data in the media independent interface 700 (FIG. 7A) in accordance with some embodiments. The running disparity scheme 700 is implemented in codec 706 (FIG. 7A) and includes 8B/10B encoders 602-0 through 602-7 for Ch0-7 and muxes 612 and 614 for Ch8-9, as described with regard to FIG. 6B. To implement multi-mode configurability, muxes 902 and 908 are coupled between the disparity output of encoder 602-7 for Ch7 and the input of flip-flop 604, the output of which is coupled to the disparity input of encoder 602-0 for Ch0. Also, the disparity output of encoder 602-7 is coupled to the input of a flip-flop 904. The output of flip flop 904 and the disparity output of encoder 602-3 are coupled to respective inputs of a mux 906, the output of which is coupled to the disparity input of encoder 602-4.

In the first mode, muxes 902, 906, and 908 are configured such that the disparity scheme 900 functions as the disparity scheme 610 (FIG. 6B). Muxes 902 and 908 are configured to provide the running disparity from Ch7, as output by encoder 602-7, to the Ch0 encoder 602-0 via flip-flop 604. Mux 906 is configured to provide the running disparity from Ch3, as output by encoder 602-3, to the Ch4 encoder 602-4. The 10B outputs of encoders 602-0 through 602-7 and muxes 612 and 614 are provided, for example, to 100B/10B mux/demux 716 (FIG. 7A). In this configuration, transmit data for Ch0-Ch7 is thus encoded in accordance with a running disparity for Ch0-Ch7. Ch0-3 may be considered a first plurality of channels and Ch4-7 a second plurality of channels; the transmit data for the first and second pluralities of channels thus is encoded in accordance with a running disparity for the first and second pluralities of channels in this configuration.

In the second mode (e.g., QSGMII mode), muxes 902 and 908 are configured to provide the running disparity from Ch3, as output by encoder 602-3, to the Ch0 encoder 602-0 via flip-flop 604. In this configuration, the encoders 602-0 through 602-3 compose a 32B/40B encoder (e.g., encoder 710-1, FIG. 7A). The 10B outputs of encoders 602-0 through 602-3 are provided, for example, to 40B/20B mux/demux 714-1 (FIG. 7A). Mux 906 is configured to provide the running disparity from Ch7, as output by encoder 602-7 and received via flip-flip 904, to the Ch4 encoder 602-4. The encoders 602-4 through 602-7 thus compose another 32B/40B encoder (e.g., encoder 710-2, FIG. 7A). The 10B outputs of encoders 602-4 through 602-7 are provided, for example, to 40B/20B mux/demux 714-2 (FIG. 7A). In some embodiments, muxes 612 and 614 are disabled in the second mode. In this configuration, transmit data for Ch0-Ch3 is thus encoded in accordance with a running disparity for Ch0-Ch3, and transmit data for Ch4-Ch7 is encoded in accordance with a running disparity for Ch4-Ch7. Ch0-3 may be considered a first plurality of channels and Ch4-7 a second plurality of channels; the transmit data for the first plurality of channels thus is encoded in accordance with a running disparity for the first plurality of channels and the transmit data for the second plurality of channels thus is encoded in accordance with a running disparity for the second plurality of channels in this configuration.

In the third mode (e.g., SGMII mode), mux 908 is configured to feed back the disparity for Ch0, as output by encoder 602-0, to encoder 602-0 via flip-flop 604. Similarly, equivalent muxes and flip-flops (not shown in FIG. 9 for visual simplicity) for each of the other channels feed back the disparity for their respective channel to the encoder 602 of their respective channel. Each of the encoders 602 thus acts as an independent 8B/10B encoder (e.g., encoder 708-1 or 708-2, FIG. 7A) in this configuration, with the transmit data for each of Ch0-Ch7 being encoded independently. The 10B outputs of the encoders 602-0 through 602-7 are provided, for example, to muxes/demuxes 714-1, which have the "10B/SGMII*4" pass-through configuration described with regard to FIG. 7A. In some embodiments, muxes 612 and 614 are disabled in the third mode.

The disparity scheme 900 thus is configurable for any of the first, second, third, and/or fourth modes.

Figure 10:
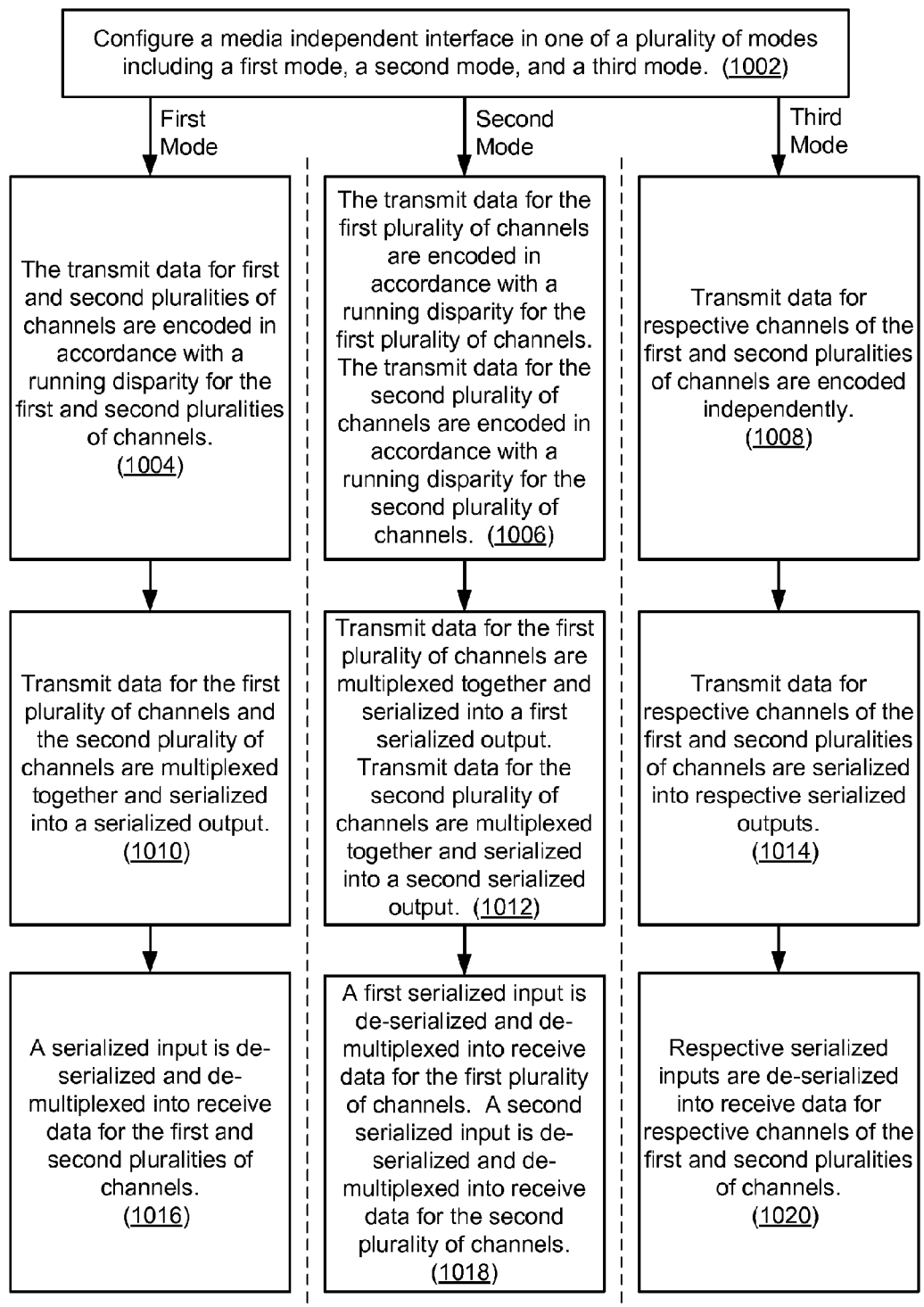
FIG. 10 is a flowchart illustrating a method of operating a configurable media independent interface in accordance with some embodiments.

FIG. 10 is a flowchart illustrating a method 1000 of operating a configurable media independent interface in accordance with some embodiments. In the method 1000, a media independent interface (e.g., interface 700, FIG. 7A) is configured (1002) in one of a plurality of modes including a first mode, a second mode, and a third mode (e.g., the first, second, and third modes described with regard to FIGS. 7A-7C).

In the first mode, the transmit data for both a first plurality of channels (e.g., Ch0-Ch3) and a second plurality of channels (e.g., Ch4-Ch7) are encoded (1004) in accordance with a running disparity for first and second pluralities of channels. For example, the transmit data for Ch0-Ch7 is encoded in accordance with the disparity scheme 900 (FIG. 9), with mux 906 configured to provide the running disparity from Ch3 to the encoder 602-4 for Ch4, and with muxes 902 and 908 configured to provide the running disparity from Ch7 to the encoder 602-0 for Ch0.

Transmit data for the first plurality of channels and the second plurality of channels are multiplexed together and serialized (1010) into a serialized output. For example, mux/demux 716 (FIGS. 7A-7C) multiplexes the encoded data for Ch0-Ch7 and the serializer of first SerDes 730 (FIGS. 7B-7C) serializes the multiplexed data into a serialized output.

Also in the first mode, a serialized input is de-serialized and de-multiplexed (1016) into receive data for the first and second pluralities of channels. For example, the de-serializer of first SerDes 730 (FIGS. 7B-7C) de-serializes the serialized input and the mux/demux 716 (FIGS. 7A-7C) demultiplexes the de-serialized input into encoded receive data for Ch0-Ch7.

In some embodiments of the first mode, idle symbols for a third plurality of channels (e.g., Ch8-9) are multiplexed together with the transmit data for the first and second pluralities of channels (e.g., by mux/demux 716, FIGS. 7A-7C) and serialized into the serialized output (e.g., by the serializer of first SerDes 730, FIGS. 7B-7C).

In the second mode, the transmit data for the first plurality of channels are encoded (1006) in accordance with a running disparity for the first plurality of channels. The transmit data for the second plurality of channels are encoded (1006) in accordance with a running disparity for the second plurality of channels. For example, the transmit data for Ch0-Ch7 is encoded in accordance with the disparity scheme 900 (FIG. 9), with mux 906 configured to provide the running disparity from Ch7 to the encoder 602-4 for Ch4, and with muxes 902 and 908 configured to provide the running disparity from Ch3 to the encoder 602-0 for Ch0.

Transmit data for the first plurality of channels are multiplexed together and serialized (1012) into a first serialized output. For example, mux/demux 714-1 multiplexes the transmit data for Ch0-Ch3 and the serializer of secondSerDes 732 serializes the multiplexed transmit data. Transmit data for the second plurality of channels are multiplexed together and serialized (1012) into a second serialized output. For example, mux/demux 714-2 multiplexes the transmit data for Ch4-Ch7 and the serializer of first SerDes 730 serializes the multiplexed transmit data.

Also in the second mode, a first serialized input is de-serialized and de-multiplexed (1018) into receive data for the first plurality of channels. For example, the de-serializer of first SerDes 730 de-serializer the first serialized input and the mux/demux 714-2 demultiplexes the de-serialized data. A second serialized input is de-serialized and de-multiplexed (1018) into receive data for the second plurality of channels. For example, the de-serializer of second SerDes 732 de-serializes the second serialized input and the mux/demux 714-1 demultiplexes the de-serialized data.

In some embodiments of the second mode, the third plurality of channels (e.g., Ch8-Ch9) is disabled.

In the third mode, transmit data for respective channels of the first and second pluralities of channels are encoded (1008) independently. For example, the transmit data for Ch0-Ch7 are encoded in accordance with the disparity scheme 900 (FIG. 9), with mux 908 configured to provide the disparity from Ch0 back to the encoder 602-0 for Ch0, and likewise for other channels.

Transmit data for respective channels of the first and second pluralities of channels are serialized (1014) into respective serialized outputs. For example, all or a portion of the SerDes 730, 732, and 734 serialize transmit data for respective ones of Ch0-7.

Also in the third mode, respective serialized inputs are de-serialized (1020) into receive data for respective channels of the first and second pluralities of channels. For example, all or a portion of the SerDes 730, 732, and 734 de-serialize receive data for respective ones of Ch0-7.

In some embodiments of the third mode, the third plurality of channels (e.g., Ch8-Ch9) is disabled.

The method 1000 thus allows the same media independent interface to be configured to operate in accordance with different protocols. While the method 1000 includes a number of operations that appear to occur in a specific order, it should be apparent that the method 1000 can include more or fewer operations, which can be executed serially or in parallel. An order of two or more operations may be changed, and two or more operations may be combined into a single operation. For example, all or a portion of the operations for a given mode are performed simultaneously in an ongoing manner during operation of the interface.

In the foregoing specification, the present embodiments have been described with reference to specific exemplary embodiments thereof. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense.

What is claimed is:

1. A configurable media independent interface in an integrated circuit device, comprising:
a first plurality of channels, wherein each channel of the first plurality comprises a transmit path;
a second plurality of channels, wherein each channel of the second plurality comprises a transmit path;
a first serializer configurable to serialize transmit data for the first and second pluralities of channels in a first mode and to serialize transmit data for the first plurality of channels in a second mode; and
a second serializer configurable to be disabled in the first mode and to serialize transmit data for the second plurality of channels in the second mode, wherein the first mode corresponds to a first protocol, and the second mode corresponds to a second protocol.

2. The media independent interface of claim 1, wherein each channel of the first and second pluralities of channels further comprises a receive path, and the media independent interface further comprises:
a first deserializer configurable to de-serialize receive data for the first and second pluralities of channels in the first mode and to de-serialize receive data for the first plurality of channels in the second mode; and
a second deserializer configurable to be disabled in the first mode and to de-serialize receive data for the second plurality of channels in the second mode.

3. The media independent interface of claim 1, further comprising a third plurality of channels configurable to transmit idle symbols in the first mode and to be disabled in the second mode.

4. The media independent interface of claim 1, wherein:
the first serializer is configurable in a third mode to serialize data for a respective channel of the first plurality of channels; and
the media independent interface further comprises additional serializers configurable to serialize additional respective channels of the first plurality of channels in the third mode and to be disabled in the first and second modes.

5. The media independent interface of claim 4, wherein:
the second serializer is configurable in the third mode to serialize data for a respective channel of the second plurality of channels; and
the media independent interface further comprises additional serializers configurable to serialize additional respective channels of the second plurality of channels in the third mode and to be disabled in the first and second modes.

6. The media independent interface of claim 4, wherein:
each channel of the first and second pluralities of channels further comprises a receive path; and
the media independent interface further comprises a first deserializer configurable to de-serialize receive data for the first and second pluralities of channels in the first mode, to de-serialize receive data for the first plurality of channels in the second mode, and to de-serialize receive data for a respective channel of the first plurality of channels in the third mode.

7. The media independent interface of claim 6, further comprising a second deserializer configurable to be disabled in the first mode, to de-serialize receive data for the second plurality of channels in the second mode, and to de-serialize receive data for a respective channel of the second plurality of channels in the third mode.

8. The media independent interface of claim 4, further comprising a third plurality of channels configurable to transmit idle symbols in the first mode and to be disabled in the second and third modes.

9. The media independent interface of claim 1, further comprising a codec, coupled to the first and second serializers, to encode the transmit data for the first and second pluralities of channels.

10. The media independent interface of claim 9, further comprising multiplexing/demultiplexing circuitry, coupled between the codec and the first and second serializers, to multiplex and demultiplex data communicated between the codec and the first and second serializers, wherein:
in the first mode, data communicated between the codec and the multiplexing/demultiplexing circuitry has a first width and data communicated between the codec and the first serializer has a second width that is a fraction of the first width; and
in the second mode, data communicated between the codec and the multiplexing/demultiplexing circuitry has a third width and data communicated between the codec and the first and second serializers has a fourth width that is a fraction of the third width.

11. The media independent interface of claim 10, wherein the multiplexing/demultiplexing circuitry comprises:
a first multiplexer/demultiplexer coupled to the codec;
a second multiplexer/demultiplexer coupled to the codec; and
a third multiplexer/demultiplexer to couple the first multiplexer/demultiplexer to the first serializer in the first mode and to couple the second multiplexer/demultiplexer to the first serializer in the second mode.

12. The media independent interface of claim 9, wherein the codec is configurable:
in the first mode, to encode the transmit data for the first and second pluralities of channels in accordance with a running disparity for the first and second pluralities of channels; and
in the second mode, to encode the transmit data for the first plurality of channels in accordance with a running disparity for the first plurality of channels and to encode the transmit data for the second plurality of channels in accordance with a running disparity for the second plurality of channels.

13. The media independent interface of claim 12, wherein the codec is configurable in a third mode to encode the transmit data for respective channels of the first and second pluralities of channels independently.

14. A method of operating a configurable media independent interface in an integrated circuit device, the method comprising configuring the media independent interface in one of a plurality of modes including a first mode and a second mode, wherein:
in the first mode, transmit data for a first plurality of channels and a second plurality of channels are multiplexed together and serialized into a serialized output; and
in the second mode, transmit data for the first plurality of channels are multiplexed together and serialized into a first serialized output, and transmit data for the second plurality of channels are multiplexed together and serialized into a second serialized output, wherein the first mode corresponds to a first protocol, and the second mode corresponds to a second protocol.

15. The method of claim 14, wherein:
in the first mode, a serialized input is de-serialized and de-multiplexed into receive data for the first and second pluralities of channels; and
in the second mode, a first serialized input is de-serialized and de-multiplexed into receive data for the first plurality of channels, and a second serialized input is de-serialized and de-multiplexed into receive data for the second plurality of channels.

16. The method of claim 15, wherein:
the plurality of modes further includes a third mode; and
in the third mode, transmit data for respective channels of the first and second pluralities of channels are serialized into respective serialized outputs, and respective serialized inputs are de-serialized into receive data for respective channels of the first and second pluralities of channels.

17. The method of claim 14, wherein:
in the first mode, idle symbols for a third plurality of channels are multiplexed together with the transmit data for the first and second pluralities of channels and serialized into the serialized output; and
in the second mode, the third plurality of channels is disabled.

18. The method of claim 14, wherein:
in the first mode, the transmit data for the first and second pluralities of channels are encoded in accordance with a running disparity for the first and second pluralities of channels; and
in the second mode, the transmit data for the first plurality of channels are encoded in accordance with a running disparity for the first plurality of channels and the transmit data for the second plurality of channels are encoded in accordance with a running disparity for the second plurality of channels.

19. The method of claim 18, wherein:
the plurality of modes further includes a third mode; and
in the third mode, transmit data for respective channels of the first and second pluralities of channels are encoded independently.

20. A configurable media independent interface in an integrated circuit device, comprising:
means for multiplexing together transmit data for a first plurality of channels and a second plurality of channels in a first mode, and for separately multiplexing transmit data for the first plurality of channels and multiplexing transmit data for the second plurality of channels in a second mode; and
means for serializing the multiplexed transmit data for the first and second pluralities of channels into a serialized output in the first mode, for serializing the multiplexed transmit data for the first plurality of channels into a first serialized output in the second mode, and for serializing the multiplexed transmit data into a second serialized output in the second mode, wherein the first mode corresponds to a first protocol, and the second mode corresponds to a second protocol.

* * * * *